United States Patent
Wang-Roveda et al.

(10) Patent No.: US 10,013,384 B1
(45) Date of Patent: Jul. 3, 2018

(54) COMPRESSIVE SENSING SYSTEMS AND RELATED METHODS

(71) Applicant: ARIZONA BOARD OF REGENTS ON BEHALF OF THE UNIVERSITY OF ARIZONA, Tucson, AZ (US)

(72) Inventors: Janet M. Wang-Roveda, Tucson, AZ (US); Linda S. Powers, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 40 days.

(21) Appl. No.: 15/285,144

(22) Filed: Oct. 4, 2016

Related U.S. Application Data

(63) Continuation-in-part of application No. PCT/US2015/024351, filed on Apr. 3, 2015.
(Continued)

(51) Int. Cl.
*G06F 13/38* (2006.01)
*G06F 13/42* (2006.01)
(Continued)

(52) U.S. Cl.
CPC ............ *G06F 13/42* (2013.01); *G06F 1/3234* (2013.01); *G09G 5/003* (2013.01); *G09G 2330/021* (2013.01)

(58) Field of Classification Search
None
See application file for complete search history.

(56) References Cited

U.S. PATENT DOCUMENTS 6,266,581 B1 7/2001 Wheatley et al.
6,492,929 B1 * 12/2002 Coffey .................. H03M 1/127
341/118
(Continued)

FOREIGN PATENT DOCUMENTS

EP 2502423 A2 9/2012
WO WO2012158859 A1 11/2012
(Continued)

OTHER PUBLICATIONS

"Sparse Representations, Compressive Sensing and Dictionaries for Pattern Recognition" http://www.umiacs.umd.edu/~pvishalm/Conference_pub/ACPR2011_v2.pdf.
(Continued)

*Primary Examiner* — David E Martinez
(74) *Attorney, Agent, or Firm* — Nguyen & Tarbet Law Firm

(57) ABSTRACT

A system to transform an input signal presented from a sensor into a spatial sequence characteristic of the signal. An input module of the system is configured to divide the input signal into a sequence of signal values and present them in order of production to the following stage. A comparator module coupled to the input module configured to accept each element value of the sequence of signal values. The comparator module has a multiplicity of individual comparators that generate binary values assembled into a word of bits. The word value correlates the input sequence element value with a vector of reference values to effect a level crossing sampler. The assembled word value is utilized to encode a memory address. The system effects the conversion of a signal into an ordered collection of spatial values, which are the addresses of memory locations.

12 Claims, 18 Drawing Sheets

Related U.S. Application Data

(60) Provisional application No. 61/975,374, filed on Apr. 4, 2014.

(51) Int. Cl.
  *H03M 1/12* (2006.01)
  *H03M 1/34* (2006.01)
  *G09G 5/00* (2006.01)
  *G06F 1/32* (2006.01)

(56) References Cited

U.S. PATENT DOCUMENTS

| | | | |
|---|---|---|---|
| 6,750,909 | B1 | 6/2004 | Tsai |
| 7,463,179 | B2 | 12/2008 | Brady et al. |
| 7,839,317 | B1 * | 11/2010 | Sauer .................. H03M 1/141 |
| | | | 341/156 |
| 7,965,216 | B1 | 6/2011 | Petre et al. |
| 8,199,244 | B2 | 6/2012 | Baraniuk et al. |
| 8,547,260 | B2 | 10/2013 | Sestok et al. |
| 2004/0136034 | A1 | 7/2004 | Curry |
| 2010/0238328 | A1 | 9/2010 | Pillman et al. |
| 2010/0265799 | A1 | 10/2010 | Cevher et al. |
| 2011/0142339 | A1 | 6/2011 | Singh et al. |
| 2011/0255589 | A1 | 10/2011 | Saunders et al. |
| 2013/0128042 | A1 | 5/2013 | Bridge et al. |
| 2013/0342681 | A1 | 12/2013 | Duong |
| 2014/0063314 | A1 | 3/2014 | Sankaranarayanan et al. |

FOREIGN PATENT DOCUMENTS

| | | |
|---|---|---|
| WO | WO2013066896 A1 | 5/2013 |
| WO | WO2015154033 A1 | 10/2015 |

OTHER PUBLICATIONS

"Xampling: Compressed Sensing of Analog Signals" http://arxiv.org/pdf/1103.2960.pdf.
"Building Compressed Sensing Systems: Sensors and Analog-to-Information Converters" http://www.rle.mit.edu/isg/documents/AbariMSThesis.pdf.
"Design and Implementation of a Fully Integrated Compressed-Sensing Signal Acquisition System" http://mics.caltech.edu/publications/PDFs/Yoo-A2I-icassp-2012.pdf
"Compressive sampling strategies for integrated microspectrometers" http://www2.engr.arizona.edu/~gehm/lens/pubs/ProcSPIE.6232.pdf.
Bill Dally, "Low-Power Architecture", Keynote, ISSCC 2005.
Massoud Pedram, "Low Power Design Methodologies and Techniques: An Overview", Invited Talk at Low Power Design conference, 2012.
Peter Hofstee, "Power Efficient Processor Architecture and The Cell Processor", invited paper, High Performance Computing, 2006.
D. Donoho, "Compressive sensing," IEEE Trans. on Inform. Theory, vol. 52, No. 4, pp. 1289-1306, Sep. 2006.
E. Candes, J. Romberg, and T. Tao, "Robust uncertainty principles: exact signal reconstruction from highly incomplete frequency information," IEEE Trans. on Inform. Theory, vol. 52, No. 2, pp. 489-509, Feb. 2006.
E.J. Candès, J. K. Romberg, and T. Tao, "Stable signal recovery from incomplete and inaccurate measurements," Comm. Pure Appl. Math., vol. 59, No. 8, pp. 1207-1223, 2006.
E. Candès and J. Romberg, "Encoding the Ip ball from limited measurements," Data Compression Conference, pp. 33-42, Mar. 2006.
R. Boufounos, R. G. Baraniuk, "Quantization of Sparse Representations," Data Compression Conference, p. 378, 2007.
R. Boufounos, R. G. Baraniuk, "Sigma Delta Quantization for Compressive Sensing." Proc. SPIE Waveletts XII. Proc. of SPIE vol. 6701, 670104, (2007), doi: 10.1117/12.734880, Aug. 26-29, 2007, San Diego, CA.
P. Boufounos and R. G. Baraniuk, "1-bit compressive sensing," in Conf. on Info. Sciences and Systems (CISS), (Princeton, NJ), pp. 16-21, Mar. 2008.
V. Goyal, A. Fletcher, and S. Rangan, "Compressive sampling and lossy compression," IEEE Signal Processing Magazine, vol. 25, pp. 48-56, Mar. 2008.
L. Jacques, D. Hammond, and M. Jalal Fadili, Dequantizing compressed sensing: When oversampling and non-Gaussian constraints combine. arXiv:0902.2367, 2009.
W. Dai and O. Milenkovic, "Subspace pursuit for compressive sensing signal reconstruction," IEEE Trans. Inform. Theory, vol. 55, No. 5, pp. 2230-2249, May 2009.
D. Needell and J. A Tropp, "CoSaMP: Iterative signal recovery from incomplete and inaccurate samples," Applied and Computational Harmonic Analysis, vol. 26, No. 3, pp. 301-321, Aug. 2009.
M. Lin, "Analogue to Information System based on PLL-based Frequency Synthesizers with Fast Locking Schemes", Ph.D thesis, The University of Edinburgh, Feb. 2010.
N. G. Prelcic, "State of the art of analog to information converters", keynote presentation, 2010.
M. Mishali, R. Hilgendorf, E. Shoshan, I. Rivikin, and Y. C. Eldar, "Generic Sensing Hardware and Real-Time Reconstruction for Structured Analog Signals", ISCAS 2011.
M. Mishali, Y. C. Eldar, and A. Elron, "Xampling: Signal acquisition and processing in union of subspaces," CCIT Report No. 747, EE Dept., Technion; arXiv.org 0911.0519, Oct. 2009.
Y. C. Eldar, "Compressed sensing of analog signals in shift-invariant spaces," IEEE Trans. Signal Process., vol. 57, No. 8, pp. 2986-2997, Aug. 2009.
M. Vetterli, P. Marziliano, and T. Blu, "Sampling signals with finite rate of innovation," IEEE Trans. Signal Process., vol. 50, No. 6, pp. 1417-1428, 2002.
A. Bandyopadhyay, J. Lee, R. W. Robucci, and P. Hasler, "Matia: A Programmable 80 uW/frame CMOS Block Matrix Transform Imager Architecture", IEEE Journal of Solid-State Circuits, vol. 41, No. 3, Mar. 2006. pp. 563-672.
A. Bandyopadhyay and P. Hasler, "A fully programmable CMOS block matrix transform imager architecture," in Proc. IEEE Custom Integrated Circuits Conf. (CICC), San Jose, CA, 2003, pp. 2233-2236.
A. Bandyopadhyay, P. Hasler, and D. Anderson, "A CMOS floating-gate matrix transform imager," IEEE Sensors, vol. 5, No. 3, pp. 455-462, Jun. 2005.
P. Hasler, A. Bandyopadhyay, and D. V. Anderson, "High fill-factor imagers for neuromorphic processing anabled by floating gates," EURASIP J. Appl. Signal Process., pp. 676-689, 2003.
V. Srinivasan, G. J. Serrano, J. Gray, and P. Hasler, "A precision CMOS amplifier using floating-gates for offset cancellation," in Proc. IEEE Custom Integrated Circuits Conf. (CICC), Sep. 2005, pp. 734-737.
M. Mozhgan, C. Ken Yang, "A Low-Power Low Jitter Adaptive Bandwidth PLL and Clock Buffer", ISSCC 2003.
J. Kim, M. Horowitz, and G. Wei, "Design of CMOS Adaptive-Bandwidth PLL/DLLs: A General Approach", IEEE Transactions on Circuit and System—II: Analog and digital Signal Processing, vol. 50, No. 11, Nov. 2003.
J. Bozek, M. Mustra, K. Delac, K Delac, and M. Grgic, "A Survey of Image Processing Algorithms in Digital Mammography", Springer, 2009.
C. Quintana, S. Ojeda, G. Tirao, and M. Valente, "Mammography image detection processing for automatic micro-calcification recognition", Chilean Journal of Statistics, vol. 2, No. 2, Sep. 2011.
S. Bandyopadhyay, "Pre-processing of Mammogram Images", International Journal of Engineering Science and Technology, vol. 2 (11), 2010, pp. 6753-6758.
M. Yaffe, "Detectors for Digital Mammography", Springer, 2008.
MB. Williams, MJ. Yaffe, AD Maidment, MC Martin, JA Seibert, ED. Pisano, "Image quality in digital mammography: image acquisition", Journal of American College of Radiology, Aug. 3 (8):589-608, 2006.

(56) References Cited

OTHER PUBLICATIONS

N. Marshall, P. Monnin, H. Bosmans, F. Bochud, F. Verdun, "Image quality assessment in digital mammography: part I. Technical characterization of the systems", Physics in Medicine and Biology, Jul. 21:56 (14):4201-20, 2011.

J. Yoo, S. Becker, M. Monge, M. Loh, E. Candes, and A. Emami-Neyestanak, "Design and Implementation of a fully integrated compressed-sensing signal acquisition system", 2012 International conferences on Acoustics, Speech and Signal Processing, Mar. 25-30, 2012.

J. Yoo, S. Becker, M. Loh, M. Monge, E. Candes, and A. Emami-Neyestanak, "A 100MHz-2GHz 12.5 x Sub-Nyquist Rate Receiver in 90nm CMOS", 2012 IEEE Radio Frequency Integrated Circuits Symposium, Jun. 17-19, 2012.

J. Clemons, A. Jones, R. Perricone, S. Savarese, and T. Austin, "Effex: An Embedded Processor for Computer Vision based Feature Extractions", Design Automation Conference 2011.

E. Rosten and T. Drummond. Fusing points and lines for high performance tracking. In ICCV, vol. 2, Oct. 2005.

D. G. Lowe. Distinctive image features from scale-invariant keypoints. IJCV, 2004.

N. Dalal and B. Triggs. Histograms of oriented gradients for human detection. In CVPR, 2005.

D. Nguyen, K. Ren, and J. M. Roveda, "A New Data Acquisition Design for Breast Cancer Detection System", IEEE-SOCC, Sep. 2013.

"16-Channel, 24-Bit Analog to Digital Converter", Texas Instruments Data sheet on ADS 1258 for years 2005-2011. http://www.ti.com/lit/ds/symlink/ads1258.pdf.

"Compressive Imaging: A New Single-Pixel Camera" http://dsp.rice.edu/cscamera.

"Analog to Information Breaking the Nyquist Barrier" http://www-stat.stanford.edu/~candes/A2IWeb/nus.html.

"CapMux: A Scalable Analog Front End for Low Power Compressed Sensing" http://nesl.ee.ucla.edu/fw/zainul/Igcc12_capmux.pdf.

\* cited by examiner

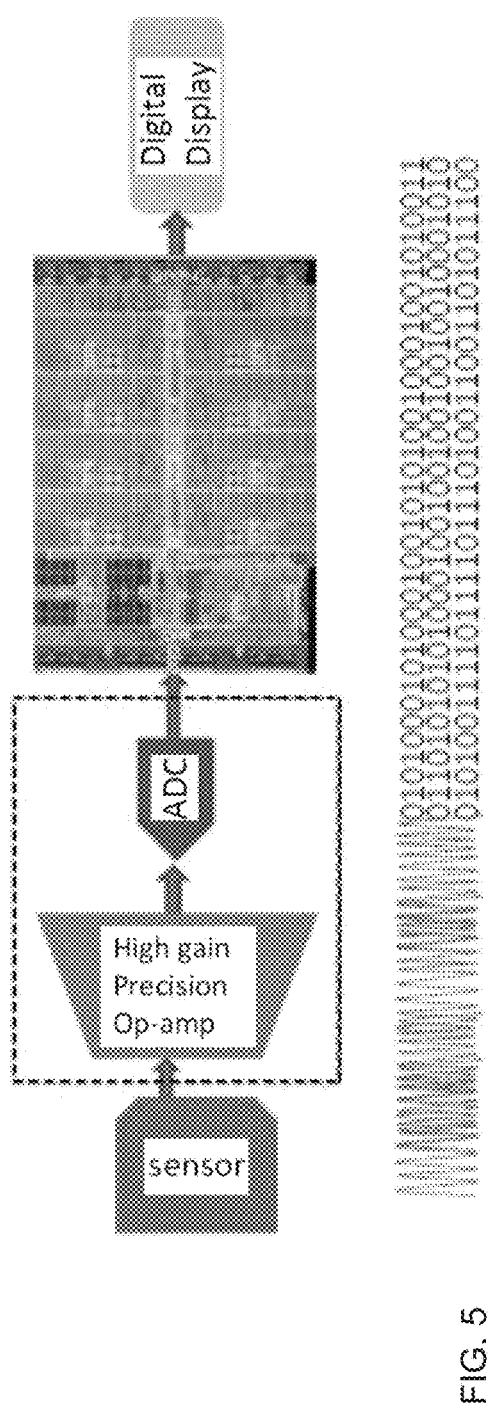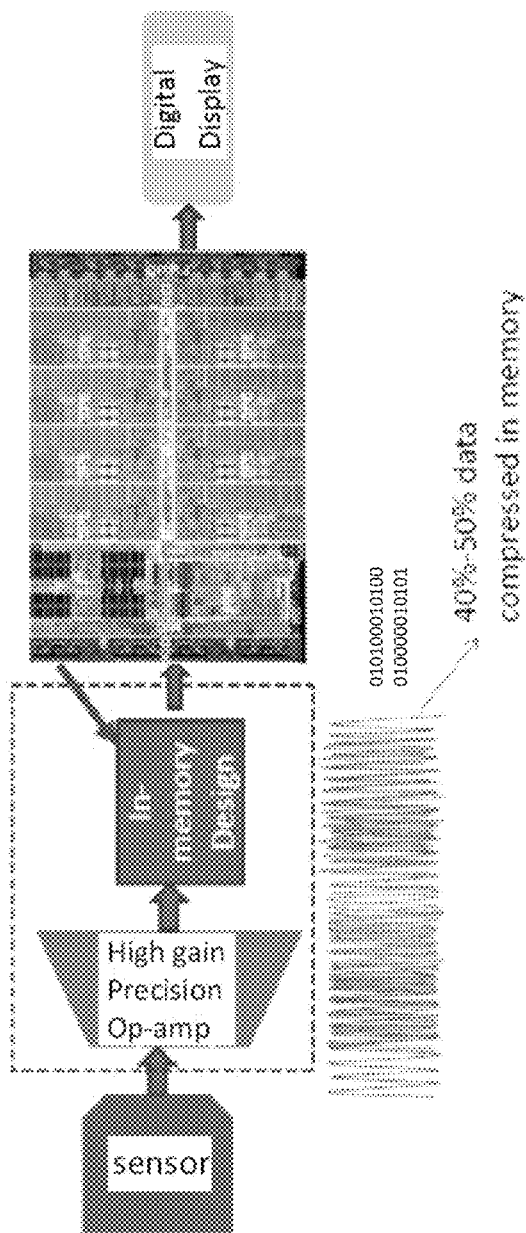
FIG. 5 (prior art)
FIG. 6

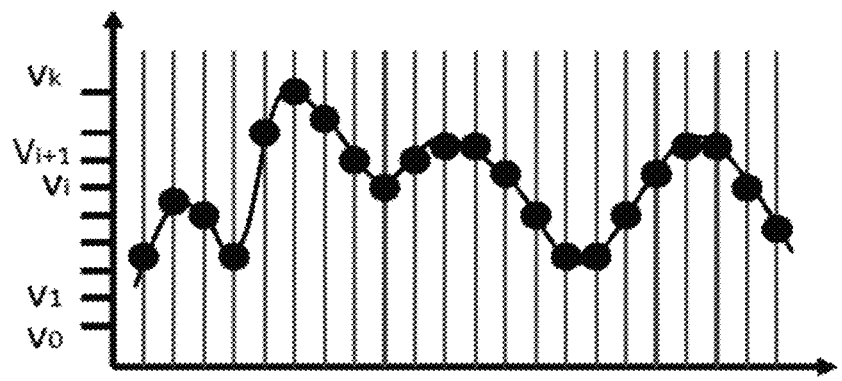
FIG. 8A Nyquist Sampling
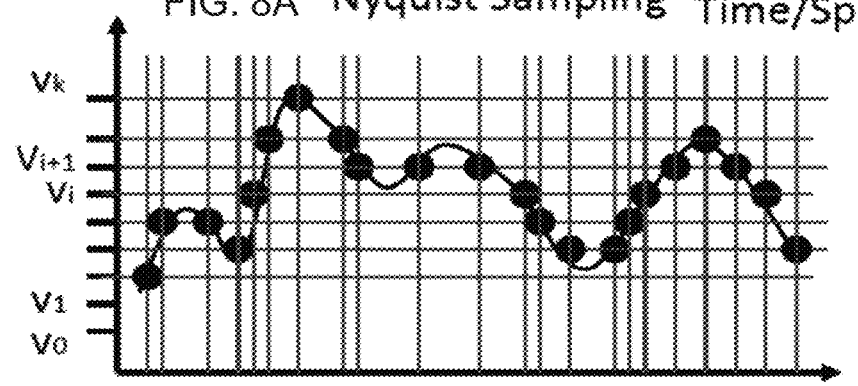
FIG. 8B Level Crossing Sampling
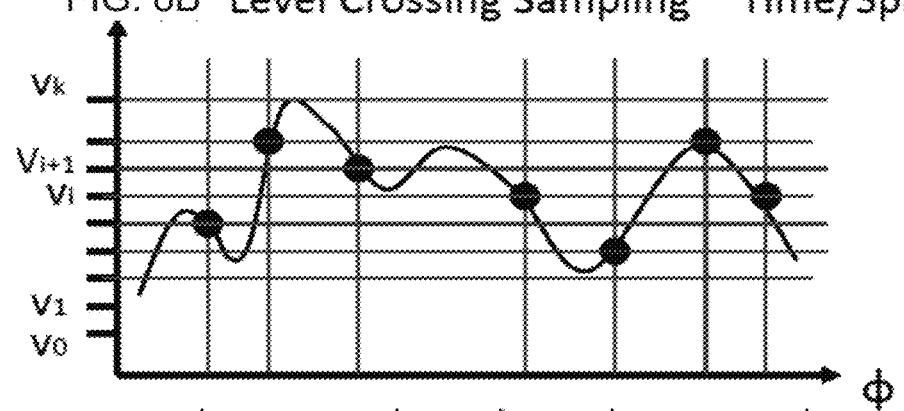
FIG. 8C Level Crossing based Random Sampling

11000

| 11100 | providing an input module configured to receive, from a sensor module, a first input signal portion of an input signal, the first input signal portion comprising a first signal value |

| 11200 | providing a comparator module coupled to the input module and configured to generate, from the first input signal portion, a first binary input vector that correlates the first signal value to a first reference signal level |

| 11300 | providing a memory module coupled to the comparator module, comprising a first selection matrix, and configured to calculate a first compression product of the first selection matrix and the first binary input vector |

| 11400 | providing an output module coupled to the memory array and configured to output a compressed output having a first compressed output component comprising the first compression product |

| 12100 | receiving, at an input module, a first input signal portion of an input signal gathered by a sensor, the first input signal portion comprising a first signal value |

| 12200 | generating, with a comparator module coupled to the input module, a first binary input vector that correlates the first signal value to a first reference signal level |

| 12300 | generating, from a memory module coupled to the comparator module and comprising a first selection matrix, a first compression product of the first selection matrix and the first binary input vector |

| 12400 | outputting, via an output module coupled to the memory array, a compressed output of the input signal such that the compressed output includes a first compressed output component comprising the first compression product |

FIG. 19

COMPRESSIVE SENSING SYSTEMS AND RELATED METHODS

CROSS REFERENCE

This application is a continuation-in-part and claims benefit of PCT Application No. PCT/US15/24351 filed Apr. 3, 2015, which claims benefit of U.S. Provisional Patent Application No. 61/975,374, filed Apr. 4, 2014, the specification(s) of which is/are incorporated herein in their entirety by reference.

FIELD OF THE INVENTION

The present invention relates to data processing systems, and relates, more particularly, to compressive sensing systems and related methods.

BACKGROUND OF THE INVENTION

Power is one of the biggest challenges facing the semiconductor industry because every generation of CPU uses about twice as much power as the previous one. Researchers are exploring new ideas at various design stages to solve this issue. While we believe that most of the existing ideas in low power VLSI design are valid, we also need to focus on how we sample the external objects, extract the features, and process the data. Here, we provide a completely different approach to low power design. We start from the mixed signal data collection and integrate the sampling scheme with memory and digitization. This integrated interface model will reduce the data amount at the very beginning of data acquisition. Thus, data received at the CPU, as well as power consumption in the CPU, will be greatly reduced.

For every generation of high end CPU, the power consumption increases by 2×. While we scale down transistor feature size, our processors are also becoming less power/energy efficient. So where does the energy go? Bill Daily in his recent talk [1] pointed out that "data movement", "driving long wires", "accessing arrays" and "control overhead" are the four major factors that caused energy waste in CPUs. One solution he suggested was stream computing. IBM's Cell processor is one such solution. Viewed as a major breakthrough in image processing for game console development in 2005, the Cell processor demonstrated 197 Gb/s data flow at 3.2 GHz for a Synergistic Processing Unit (SPU) [2][3] with 70 W average power consumption. This allows high definition display for computer entertainment systems in real time.

Stream computing is not limited to game consoles, computers and servers. Thanks to a rapid growth of wired or wireless sensors for various applications, CPU and processors have been applied as part of the data acquisition systems in a number of areas including communication, military tracking and monitoring, health care, physical/biology/chemical experiments, environmental testing, and transportation carriers [2].

FIG. 5 shows a diagram for a typical data acquisition system. It has a sensor with analog mixed signal front end and stream processor. The performance of these two components is very different. Most analog front ends consume 2/3 of the total chip area. While the power consumption is in the µW to mW range, the ability to sample and process data is a lot slower than digital processors. For example, a typical 24 bit ADC at Texas Instruments [4] is capable of 125 k sps (sample per second) which leads to 3 Mbps data processing speed. With 197 Gb/s of cell processor SPU, the analog front end is several orders of magnitude slower. This means that with the current stream processor capability, we can consider real time control of the analog front end to obtain "useful" samples. The term "useful" samples refer to the most important information embedded in the samples.

Traditional data acquisition systems discard a lot of data right before it is transmitted. In contrast, this invention presents a new architecture that is data/information oriented and allows us to reduce the amount of data from the very beginning. FIG. 6 demonstrates a proposed architecture for the new data acquisition system. Note that the data is reduced at the analog front end, thus the stream processor receives only a fraction of the total amount of original data. With a reduced amount of data, less energy will be consumed in "data movement", "driving long wires", "accessing arrays" and "control overhead" in the stream processors.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

SUMMARY OF THE INVENTION

The advances in nanometer electronic systems, compressive sensing (CS) [5-15] based information processing, and stream computing technologies have empowered us with great potential in creating novel hardware/software platforms having fast image processing capability. Driven by these new technology developments, it is an objective of the present invention to provide for a high speed "Adaptive Design for Information" (ADI) system that leverages the advantages of feature-based linear mapping data compression, low power nanometer CMOS technology, and stream computing. In particular, we address practical considerations that arise in implementation for the mixed signal interface circuits (in-memory design in FIG. 6) and how this will integrate with stream processors to achieve an adaptive, low power, and real-time data acquisition architecture. In this implementation, we develop a level-crossing sampling approach to replace Nyquist sampling.

One of the unique and inventive technical features of the present invention is a new front end circuit that combines the level-crossing concept with random selection matrices. Without wishing to limit the invention to any theory or mechanism, it is believed that the new circuit of the present invention advantageously performs digitization only when there is specified variation in the analog input and when the random selection matrix chooses this input. The new sampling concept is implemented as an in-memory design to replace traditional Analog to Digital converter (A/D) and data compression mechanisms. None of the presently known prior references or work has the unique inventive technical feature of the present invention.

According to one embodiment, the present invention features a system to transform an input signal presented from a sensor into a spatial sequence characteristic of the signal in real-time. The system may comprise an input module configured to divide the input signal into a sequence of signal values and present them in order of production to the following stage; and a comparator module coupled to the input module configured to accept each element value of the sequence of signal values. In one embodiment, the comparator module comprises a multiplicity of individual comparators which generate binary values assembled into a word of bits whose word value correlates the input sequence element value with a vector of reference values to effect a level crossing sampler, and which assembled word value is utilized to encode a memory address. Each component reference value of the reference vector may be fed to a corresponding one of the individual comparators with the reference value vector being provided by an external agent. Preferably, the system effects the conversion of a signal into an ordered collection of spatial values, the spatial values being the addresses of memory locations. In some embodiments, a sampling gate is interposed between the input module and the comparator module, controlled by an on-off level from an external agent, to effect sampling of the input signal sequence.

In one embodiment, the system may further comprise a memory module addressed by the address encoder of the comparator module, and an output module comprising output circuitry and control circuitry. The memory address generated by the comparator module acting on one input signal value can be used to select a particular memory location which holds a pre-computed value that correlates to the input signal value. The output module can control the generation of output values from among the memory locations of the memory module. The reference vector supplied to the comparator unit can produce a domain transformation of the input signal value and the memory value selected from the comparator address encoder acting to select values from the memory module can produce a mapping from input signal value to output value from the output module.

In another embodiment, the system may further comprise a memory module addressed by the address encoder of the comparator module, comprising a multiplicity of memory planes such that each memory address corresponds to a multiplicity of stored values, one stored value per memory plane, and an output module comprising output circuitry and control circuitry. Each memory plane may correspond to a unique basis vector of some vector space and each memory plane contains addressable collections of pre-scaled copies of its corresponding basis vector. The operation of the system may comprise taking a subsequence of input signal values of length equal to the number of memory planes and considering each signal value of the subsequence to be paired with a unique memory plane, and for each pairing of input signal value of the subsequence and its corresponding memory plane, the comparator module generates a memory address from the input signal value which is used to select a pre-scaled basis vector from the memory plane. All of the selected pre-scaled basis vectors are added together in a vector sum to become the output value of the output module causing a transformation from the vector space of the input signal subsequence to the vector space spanned by the memory module basis vectors.

In some embodiments, a random selection matrix, also stored in the memory module, may be used by the control circuitry of the output module to randomly include or discard candidate selected pre-scaled basis vectors from the accumulating vector sum to cause a linear-mapping compressive sampling.

In other embodiments, the vector space spanned by the stored pre-scaled basis vectors in the memory planes has lower dimension than the number of memory planes, thereby producing a projection transformation in the output vector from the vector space of the input sample subsequence, causing a further linear-mapping compression of the original data.

In one embodiment, the signal values arriving at this system are voltages that correspond to a measured quantity, currents that correspond to a measured quantity, or radiation that corresponds to a measured quantity. In another embodiment, the measured quantity presented to the system represents an amplitude of a signal, a frequency of a portion of a signal, a temporally-correlated measurement of a physical value, or a spatially-correlated measurement of a physical value.

According to another embodiment, the present invention features a system to transform an input signal presented to a module that performs compressive sampling of the signal in real-time. The system may comprise an input module configured to divide the input signal into a sequence of signal values and present them in order of production to the following stages through a sampling gate which is controlled by gating element on-off values held in the following memory module to effect random sparse sampling in time; a comparator module coupled to the input module through the sampling gate and configured to accept each gated input element value of the sequence of signal values, the comparator module comprises a multiplicity of individual comparators which generate binary values assembled into a word of bits whose word value correlates the sequence element value with a vector of reference values to effect a level crossing sampler, and which assembled value is utilized to encode a memory address, each reference value of the reference value vector being fed to a corresponding one of the individual comparators; a memory module coupled to the comparator module through an address encoder, configured to select an ordered collection of pre-computed basis vectors scaled by the signal amplitude level implied by the address encoding to form one summand of an output vector, and retain a running vector sum of output vector summands, and which holds the sampling gate on-off values used by the input module sampling gate; and an output module coupled to the memory module and configured to assemble one compressive output bit word vector for every completed successive sampling subsequence based on the accumulated vector sum held in the memory unit, the final sum vector being the output result, and the memory stored vector sum being reset for the next subsequence of input samples.

In preferred embodiment, the effect of these processing elements working on the input signal produces a sequence of compressive sampling output vectors that represents a reduced dimensionality sequence of the signal, compared to the sequence of signal values presented to the input module. This reduction of dimensionality being produced by selecting a subset of incoming signal values through sample gating and by utilizing a sparse random collection of basis vectors in the memory unit utilized in the formation of the output vector sum. In one embodiment, the sampling gate is interposed between the input module and the comparator module, controlled by an on-off level from an external agent, to effect random sampling of the input signal sequence, thereby resulting in a linear-mapping compressive sampling.

In some embodiments, the signal values arriving at this system are voltages that correspond to a measured quantity, currents that correspond to a measured quantity, or radiation that corresponds to a measured quantity. In other embodiments, the measured quantity presented to the system represents an amplitude of a signal, a frequency of a portion of a signal, a temporally-correlated measurement of a physical value, or a spatially-correlated measurement of a physical value.

BRIEF DESCRIPTION OF THE DRAWINGS

The features and advantages of the present invention will become apparent from a consideration of the following detailed description presented in connection with the accompanying drawings in which:

FIG. 5 shows a prior art Block Diagram for Data Acquisition System.

FIG. 6 shows a new architecture with an analog mixed single interface design that can reduce the amount of data (in-memory design).

FIG. 8A shows a regular Nyquist sampling scheme where a clock with period Tclk controls when sampling will occur [17]. FIG. 8B shows a level-crossing sampling scheme [17]. FIG. 8C shows a proposed level-crossing based random selection.

FIG. 18 shows a flowchart for a method for providing a sensor system.

FIG. 19 shows a detailed flowchart for block 11200 of method.

DESCRIPTION OF PREFERRED EMBODIMENTS

Figure 1:
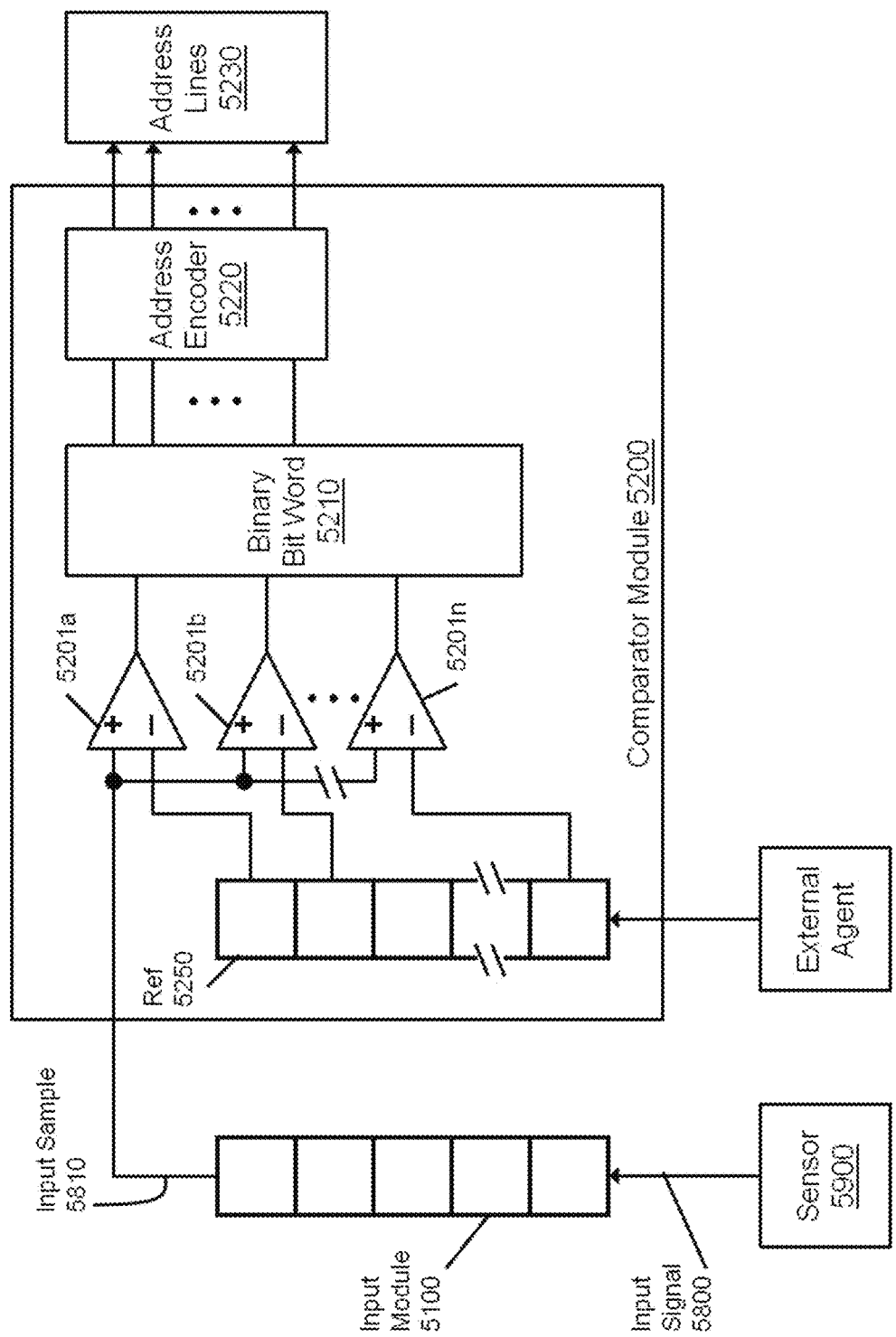
FIG. 1 shows an input module that chops the signal arriving from a sensor into sample units and delivers these units in order of arrival to a comparator module.

The present disclosure will be better understood from reading the detailed description of examples of embodiments herein, taken in conjunction with the accompanying figures.

For simplicity and clarity of illustration, the figures illustrate the general manner of construction, and descriptions and details of well-known features and techniques may be omitted to avoid unnecessarily obscuring the invention. Additionally, elements in the figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "asserted" and "disasserted" refer to opposite states regardless of, for example, (a) whether "asserted" is represented by a logic "1," a positive voltage, or a positive current, and "disasserted" is represented by a logic "0," a negative or zero voltage, or a negative or zero current, or (b) whether "disasserted" is represented by a logic "1," a positive voltage, or a positive current, and "asserted" is represented by a logic "0," a negative or zero voltage, or a negative or zero current.

The terms "couple," "coupled," "couples," "coupling," and the like should be broadly understood and refer to connecting two or more elements or signals, electrically, mechanically or otherwise. Two or more electrical elements may be electrically coupled, but not mechanically or otherwise coupled; two or more mechanical elements may be mechanically coupled, but not electrically or otherwise coupled; two or more electrical elements may be mechanically coupled, but not electrically or otherwise coupled. Coupling (whether mechanical, electrical, or otherwise) may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types. The absence of the word "removably," "removable," and the like near the word "coupled," and the like does not mean that the coupling, etc. in question is or is not removable.

Different examples and embodiments are disclosed herein. Such examples and embodiments may be found in the figures, in the claims, and/or in the present description.

Referring to FIG. 1, the present invention features an input module 5100 that chops the signal 5800 arriving from a sensor 5900 into sample units 5810 and delivers these units in order of arrival to a comparator module 5200. In some embodiments of this system, we can produce a mapping from a time-ordered stream of sensor data samples to an ordered collection of spatial data. The input module 5100 develops sensor data samples from incoming raw sensor values.

The comparator module 5200 comprises a bank of individual comparators; where, in some embodiments, all comparators may be fed from the same sensor data sample, but with their individual comparison reference levels supplied by corresponding elements of a vector of reference levels. The reference vector 5250 may be developed and delivered to the comparator module 5200 by an external control agent, i.e., an executive controller which could either be hardwired circuitry, firmware, or a programmable microprocessor.

The output from each individual comparator produces a binary level, which could be interpreted as a binary 0 value when the sample data level is below the reference level and as a binary 1 value when the sample data level is above the reference level. The individual comparators each may serve as a level crossing sampler.

The binary outputs from all of the constituent comparators could be assembled into a bit vector register 5210 and presented to an address encoder 5220. An address encoder 5220 may perform combinatorial Boolean operations on the bits in the register to produce spatial addresses 5230 from each pattern of bits in the register.

There may be no requirement that all the reference levels be uniformly spaced. Indeed, by creatively managing the spacing between reference levels, emphasis may be given to specific ranges of input signal sample levels. The spacing of reference levels may be dense in ranges of input level that are of most interest, and sparser spacing may be utilized in ranges where input levels are considered less important in some sense. And being under control of an external agent, the reference levels may be adaptively modified during the operation of this system.

Hence, the actions of the input module 5100 combined with those of the comparator module 5200 may be such as to cause an arbitrary mapping of the input sensor data range, here called the domain of the system input, to spatial coordinates represented by an encoded address that may correspond to specific levels of the signal. Addresses specify spatial locations, and so we may achieve a mapping from a temporal sequence of sensor values to an ordered sequence of spatial references.

Figure 2:
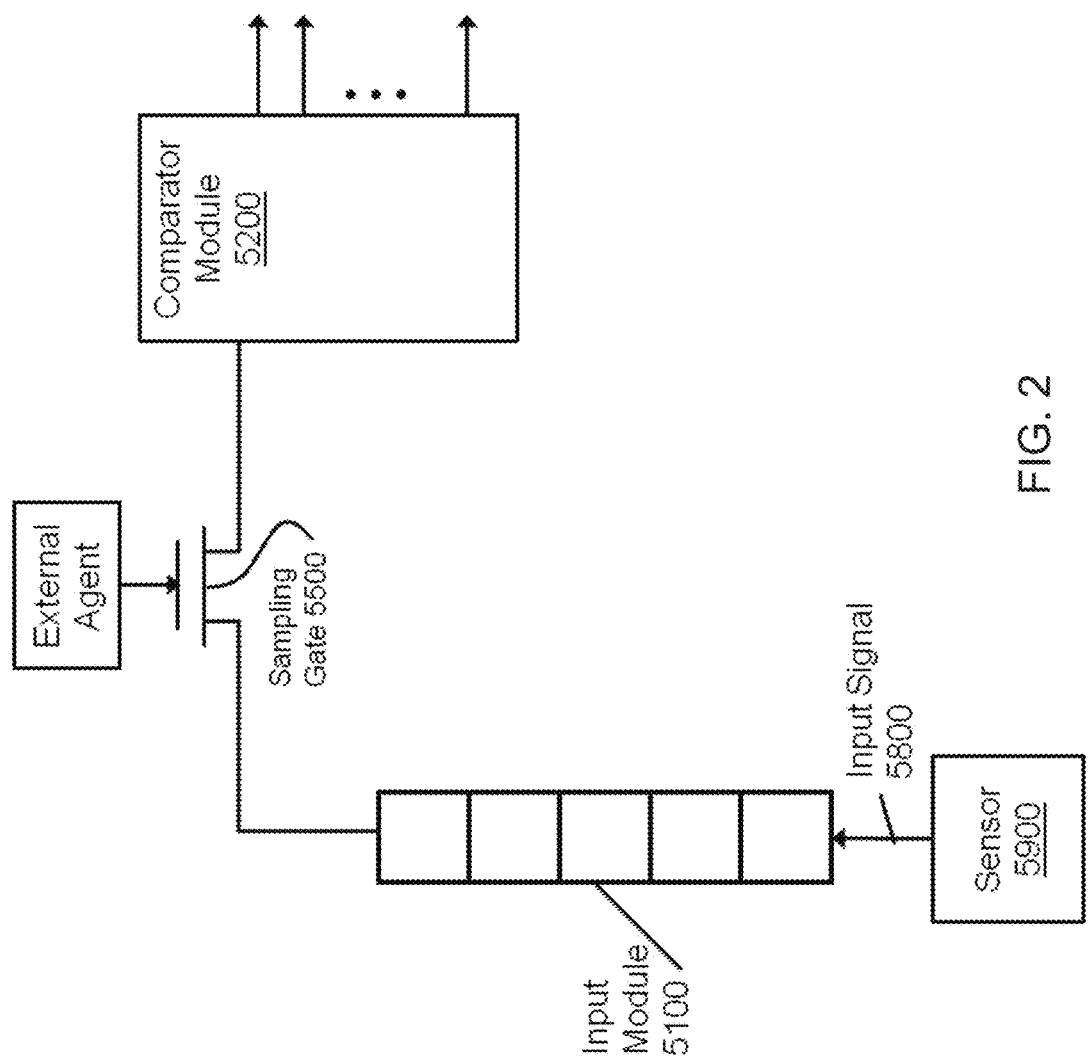
FIG. 2 shows sample values for delivery to the comparator module that may be selectively or randomly gated, or elided, under control of an external agent.

Referring to FIG. 2, in some instances the sample values for delivery to the comparator module 5200 may be selectively or randomly gated 5500, or elided, under control of an external agent, which could produce a type of compressive sampling of the sensor data. Simple sub-sampling may be caused by gating every Nth sensor sample. But a more productive operation may involve randomly eliding arriving sensor samples.

Figure 3:
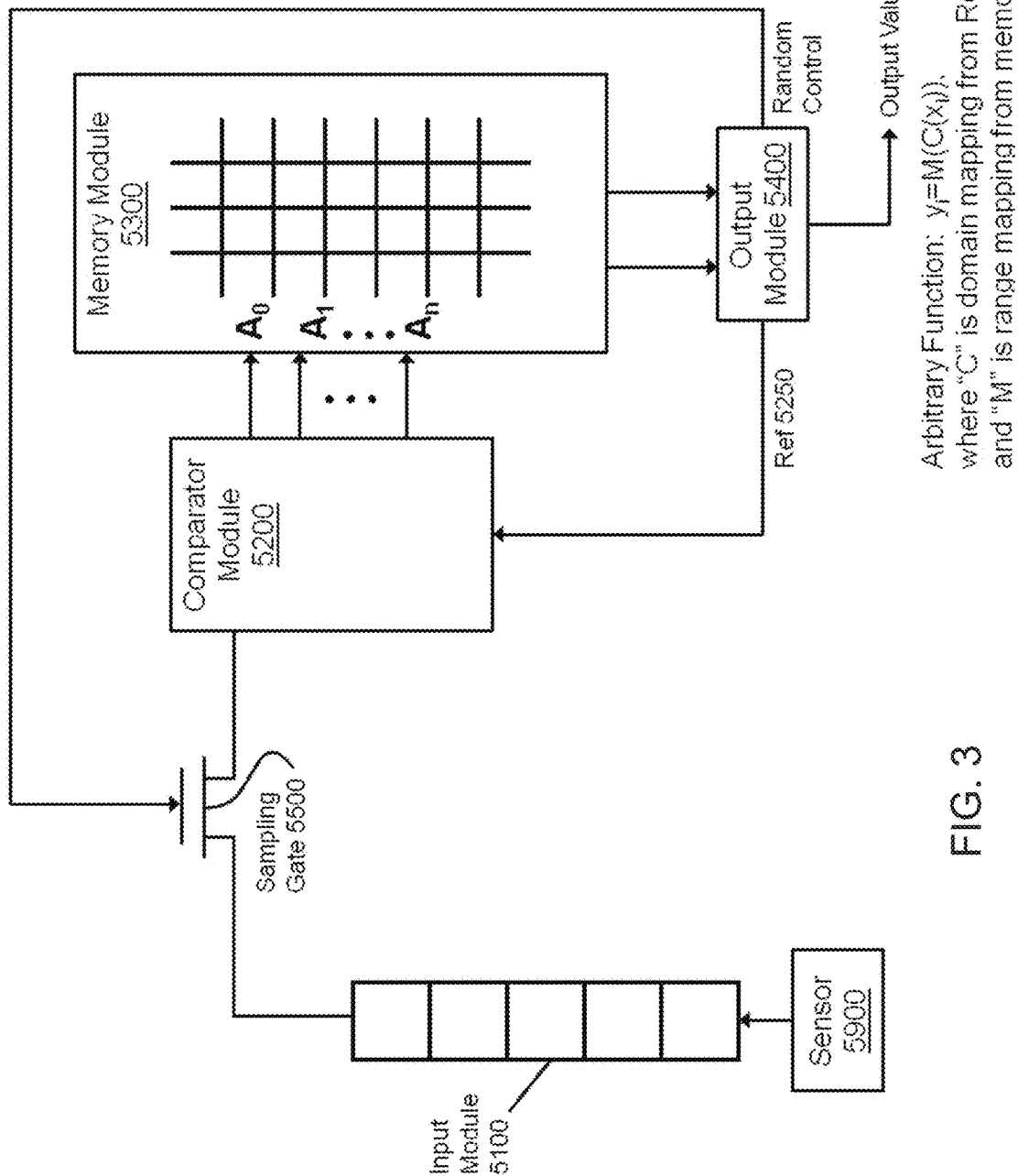
FIG. 3 shows a memory module and an output module.

Referring to FIG. 3, the system is further comprised of a memory module 5300 and an output module 5400. For purposes of this specification, the control circuitry contained in the output module 5400 could be considered to act as the external control agent referred to previously. The address lines 5230 controlled by the comparator module 5200 may be used to address memory locations in the memory module 5300.

When a single scalar value is extracted from a memory location selected for each incoming sensor sample, this augmented system may perform arbitrary scalar function mapping of sensor levels. The comparator module 5200 may perform an arbitrary domain mapping as mentioned above, and the selected memory scalar values may produce an arbitrary range mapping.

Together these operations imply that the output, denoted by $y_i$, developed from an input sensor level, denoted as $x_i$ can be written as $y_i = M(C(x_i))$. The index "i" numbers the sample position in the stream of samples arriving from the input module 5100. Function operator, M, denotes the result of selecting the value from the memory module 5300 corresponding to its input address argument. Function operator, C, denotes the result of mapping the domain of the sensor levels, through the actions of the comparator module 5200, into an address for the memory module 5300.

Figure 4:
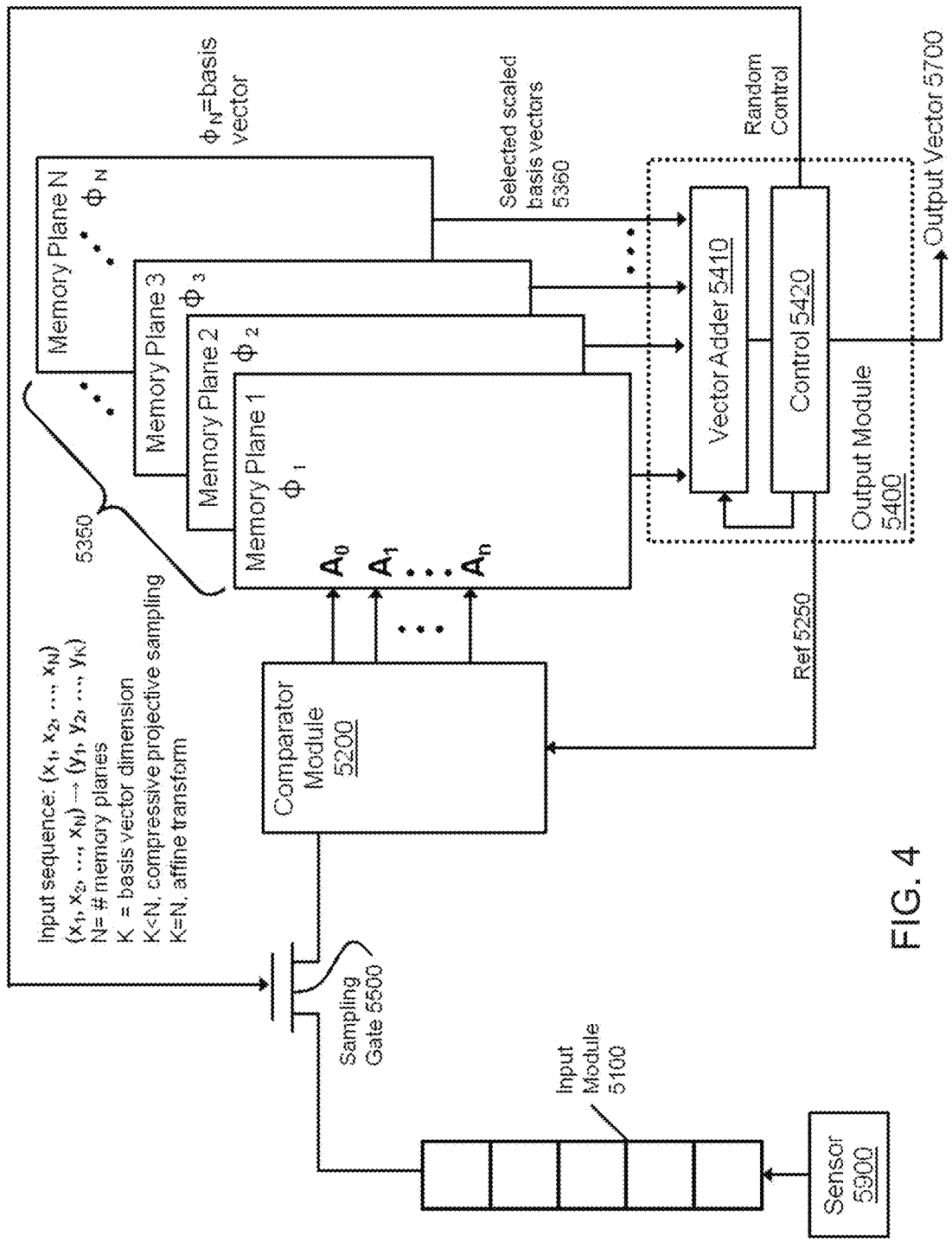
FIG. 4 shows an alternative augmentation with a composite memory module comprised of a multiplicity of memory banks or slices.

Referring to FIG. 4, an alternative augmentation of the first system is shown with a composite memory module 5300 comprised of a multiplicity of memory banks or slices 5350. All of the memory slices 5350 may behave identically with respect to incoming addresses, and upon presentation of any particular address, together these slices may offer a multi-valued result to the output module 5400. This could be used in several ways:

In some applications we may want to form input-weighted sums of basis vectors:

$$\vec{y} = \sum_{i=1}^{N} x_i \hat{\varphi}_i$$

where the output unit may produce vectors $\vec{y}$, input signal values may provide weights $x_i$, and the memory unit may hold copies of basis vectors $\hat{\varphi}_i$.

For such applications, we may arrange for each memory cell to hold entire vectors that represent scaled copies of individual basis vectors 5360 of the output vector space. The scaled copies might be arranged, in each memory slice, so that they correlate with the level of the input sensor sample that produces the address of the scaled basis vector 5360. Each memory slice might be assigned a unique basis vector, and the contents of that memory slice might comprise only the scaled copies of its assigned basis vector 5360.

Then as each successive sensor input sample from the input vector is processed, it may be paired up with a unique memory slice so that the correlated scaled basis vector 5360 in that particular memory slice could be provided to the output module 5400. While all memory slices may respond to the same address from the comparator module 5200, we may only be interested in the sequential access to each memory slice paired with input vector elements in the position of the input vector element currently being processed.

After all elements of the sensor input sample vector have been processed, the output module 5400 may have been provided with a collection, $\{x_i \hat{\varphi}_i\} i=1 \ldots N$, of scaled basis vectors 5360 that correspond to each component of the input sample vector 5810. The output module 5400 could form the vector sum 5410 of these scaled basis vectors to produce an output vector 5700 which could represent a sample vector from the output vector space spanned by the basis vectors.

Since the scaled basis vectors 5360 could arrive at the output module 5400 in a time sequence in lock step with the processing of each constituent sensor data sample in the input vector 5810, the output vector sum 5410 could be performed incrementally, or the sum could be delayed until all summand vectors were available. For every N input samples that make up input vectors of length N, and correspondingly N memory slices, there may be one output vector 5700 developed from the sum of all constituent scaled basis vectors.

When the dimension, K, of the individual basis vectors, used to fill the memory slices, equals the dimension, N, of the sensor sample input vector, we may have the ability to produce arbitrary linear mappings from the input vector space onto itself. Examples of such transformations could be in-situ discrete Fourier spectrum derivation, or arbitrary geometric transformations of scaling, rotating, shearing, warping, etc.

When the dimension, K, of the individual basis vectors is smaller than the dimension, N, of the input sample vector space we could have the result of a projective mapping from the higher dimensional input vector space to a lower dimensional output vector space.

In some embodiments the memory module 5300 could also hold collections of comparator reference vectors that could be furnished adaptively to the comparator module 5200 and may cause its domain mapping to vary as might be beneficial.

In other embodiments the memory module 5300 could hold random gating bits that could be used to selectively gate the input samples to the comparator module 5200, eliding some of them from processing, which may cause a compressive sampling.

In yet other embodiments, and possibly in conjunction with varying comparator reference vectors, the memory module 5300 could hold a random selection matrix whose elements could determine whether a candidate scaled basis vector from one of the memory planes 5350 may be elided from the output vector sum, which could cause a compressive sampling.

Taken together, a possibly randomly selected subset of sensor input samples, which may be warped by way of non-uniformly spaced comparator reference levels, and which may be projectively mapped from a higher dimensional input vector space to a lower dimensional output vector space, and where constituent scaled basis vectors may be selectively elided from the output vector sum by means of a random selection matrix, we may have an embodiment of compressive sampling that could encompass and possibly transcend currently practiced methods.

In-Memory Design Using a New Level-Crossing Sampling Concept

In compressive sensing theory [5-15], an example input, such as an input image, can be presented as an N×M matrix X. By using a random selection matrix Φ, we can generate a new y matrix:

$$y_{m \times M} = [\Phi]_{m \times N} [X]_{N \times M} \qquad (1).$$

Because m<<N, we reduce the total data amount. Different from JPEG and other nonlinear compression algorithms, compressive sensing linearly reduces data and preserves key features without much distortion. This is the key reason why compressive sensing can be applied to the front end of a data acquisition system instead of right before data transmission. One such example is a "single pixel camera" [16]. The camera performs random selection Φ on the sampled object. Thus, less data amount will be generated by the camera and, subsequently, enter the following data acquisition system. Depending on the sparsity of sampled data, the average data reduction of compressive sensing is about 50%. If we use joule per bit as an energy estimation, this compression algorithm may lead to a total energy/power reduction for the following data processing architecture.

While compressive sensing provides great potential, it requires careful implementation. For example, it is still being debated whether data created by a single pixel camera can provide good randomly sampled data. Over the past several years, much effort has been expended on analog-to-information conversion (AIC) [17-22], i.e., to acquire raw data at a low rate while accurately reconstructing the compressed signals. The key components under investigation were analog-to-digital converters, random filtering, and demodulation. Hasler et al. [23-27] were first to apply compressive sensing to pixel array data acquisition systems. Instead of directly extracting pixel array data to column buffers followed by processing with A/D converters, they used random selection measurement matrices to regroup the pixel data which are then fed into an A/D converter at a much lower sample rate. They implemented the random selection measurements and multipliers using analog components. Such designs choose a "heavy" analog front end to reduce the sample rate and data amount at the A/D converter. In the traditional data flow, the A/D converter is placed right after the pixel array. That is, the pixel data are directly digitized at the Nyquist sample rate. When a compressive sensing algorithm is applied, the A/D converter is placed after the random selection/demodulation and the sample rate is significantly slower. Even though compressive sensing algorithms help reduce the sample rate of the A/D converter, it comes with a price. It requires an analog front end to achieve randomized measurements which, in turn, leads to large analog computing units at the front end. These components are cumbersome and slow. For example, an analog multiplier works at 10 MHz with over 200 ns setup time. While most elements in the front end use 0.25 μm technology node, some exploit 0.5 μm technology node (i.e. floating gate technology to store random selection coefficients). By using compressive sensing to reduce the sample rate of the A/D converter, it appears that we are moving away from the current technology trend (i.e. smaller feature size transistors to achieve higher speed and lower power). Instead, we rely heavily on analog designs and computations which have difficulties in scaling. Little is known on how to build circuits that can create "good" measurement matrices. Here, "good" not only refers to effective selection matrices but also includes circuit implementation costs such as power and space requirements. In addition, the high complexity of reconstruction algorithms demands high performance computing capabilities.

In-Memory Design Architecture

Figure 7:
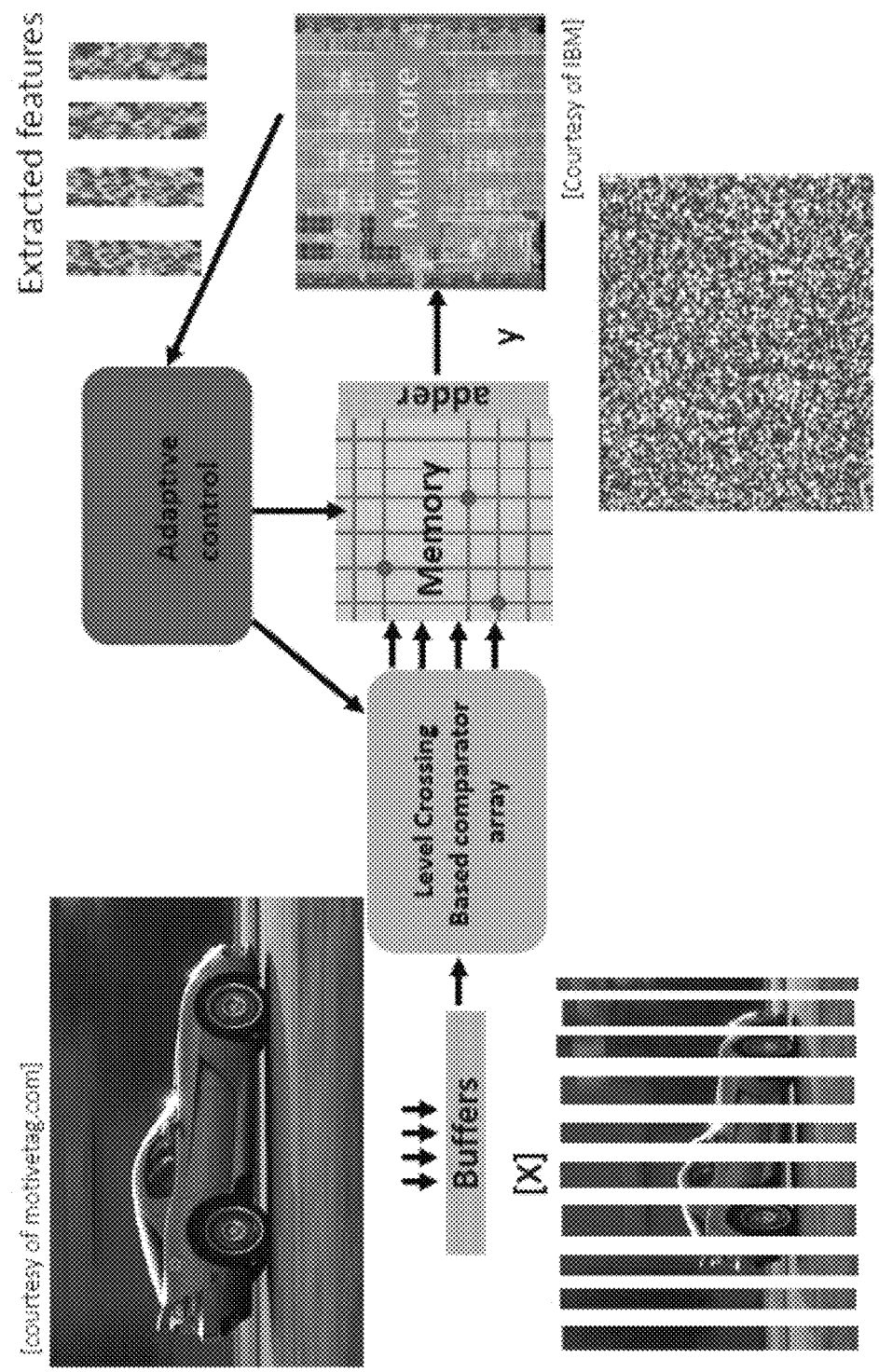
FIG. 7 shows an architecture of the present invention.

The new in-memory design will provide an effective interface module between the sensors and the stream processors. FIG. 7 demonstrates the architecture of this new design. The in-memory design has four parts: level-based sampling circuit, embedded memory, adaptive control, and other auxiliary circuits including adders.

Level-Crossing Based Comparator Array Design (Imaging Input Example)

Images have different pixel value ranges. For example, pixel values in a breast image may range from 0 to 4000 compared with lung images from 0 to 25000. After examining many images, it may be that the lung images require 15-bit quantization while the breast images require 12-bit quantization. This three-bit difference leads to 87.5% reduction in the number of comparators (15-bit requires $2^{15}$ comparators while 12-bit requires $2^{12}$ comparators), which in turn, greatly reduces the power consumption by the comparator array. Additional studies on a large number of images reveal that dense tissues lead to lower pixel values. Higher pixel values contain information about calcification spots (e.g., white spots in the mammography images), so we should focus on the accuracy of the higher voltage level of the comparators. It is possible to reuse the lower voltage level comparators to refine lower voltage level which improves the resolution. To summarize, the application decides power consumption, hardware cost, and image quality. Although imaging has been used above as an example, other types of inputs, which may be represented by analog voltages or currents, can be used in the same or other examples.

Level-Crossing based random selection can be introduced to quantize the prior knowledge of voltage level and mixing functions or random selection matrices. This new scheme is different from the regular Nyquist sampling theorem and the level-crossing ones. To illustrate, let us first discuss the difference between the Nyquist scheme and the level-crossing one. Refer to FIG. 8A-8C. FIG. 8A is the regular Nyquist sampling scheme where a clock with period Tclk controls when sampling will occur [17]. FIG. 8B displays the level-crossing sampling scheme [17]. Here a sample is accepted only if the input signal crosses one of the predefined voltage levels equally spaced with $\Delta V$. Unlike Nyquist sampling, the time that has passed between two samples (refer to A and B points and $\Delta T$ in FIG. 8B depends on the signal variations instead of the clock period. FIG. 8C demonstrates the proposed level-crossing based random selection. In addition to the level-crossing, we only perform sampling when the random selection matrix would randomly select this sample. For example, if V2 is significantly different from V1, the level-crossing scheme shows that this is a potential new sampling point. This requires a difference amplifier design between two input signals to capture signal variations. This is similar to the original level-crossing design and is not the focus of this disclosure. However, if the random selection matrix has zero value with regard to this particular sample point, we would bypass it. Therefore, a sample is taken only if it is different from the previous sample point and it is randomly selected.

Figure 9:
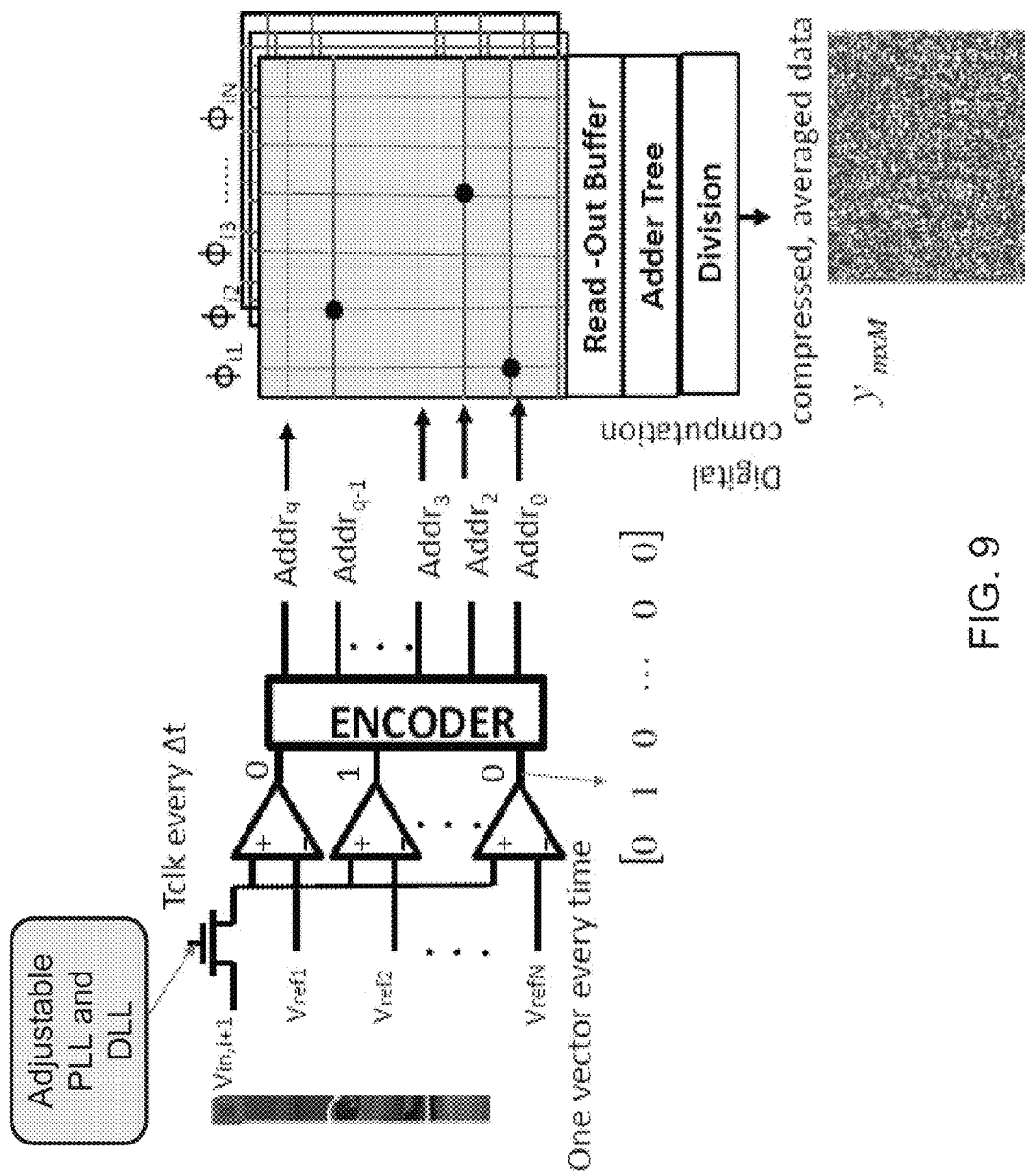
FIG. 9 shows an in-memory circuit design with level based random selection approach.

FIG. 9 illustrates a two-stage architecture for compressive sampling, focusing on how to incorporate selection, digitization and compression. In some examples, level-crossing may be implemented using circuits such as difference amplifiers [17], such as prior to receipt of the input signal at the first stage of the architecture.

The first stage of this new architecture is a comparator. The reference voltage of the comparator is a predefined threshold voltage Vth. The second stage is a memory array that stores the pre-calculated random selection matrix. Once an input signal is processed through the comparator array, this input signal is digitized. Then the corresponding addresses of the pre-stored memory array is accessed to get the product of this input signal with the random selection matrix entry through a bitwise logic AND. An adder is placed at the output of the memory access to compute compressed sensing measurements y. There are three advantages of this proposed sampling scheme. First, the sample rate of this proposed scheme depends on the sparsity of the signal, the sparsity of the random selection matrix, and the signal variations. This sample rate is much lower than the Nyquist sampling rate. Second, the majority of this design only uses digital components: memory, bypass control blocks, address encoder, and adders. The access time of memory blocks is much larger than analog multipliers. Parallel schemes can be easily applied here to improve the memory access speed. Finally, the random selection happens right after the quantization of the input signal, which may improve the digital quantization introduced error. This is contrary to the general compressive sensing scheme where quantization happens after y is generated.

Incorporation of Features into Level-Based Random Selection

Figure 10B:
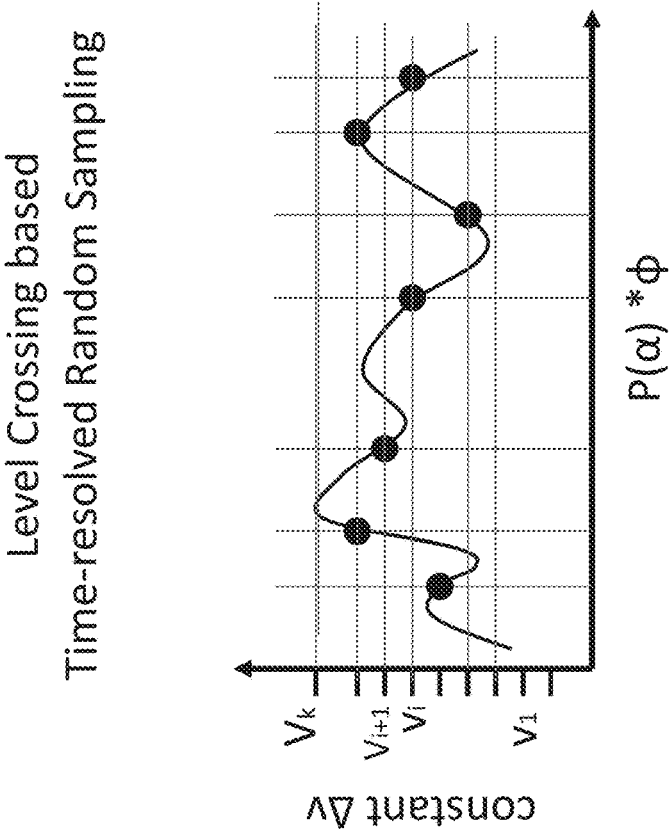
FIG. 10A-10B shows data sampling with feature integration.
Figure 10A:
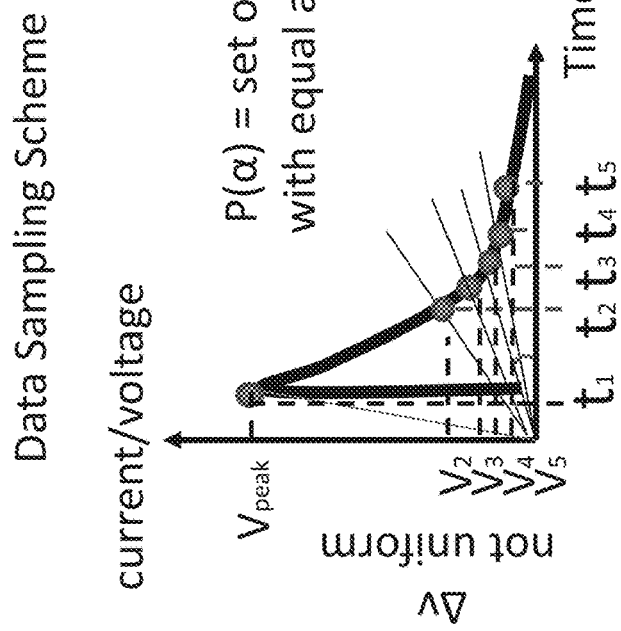

Time-resolved fluorescence data collection with a photo-multiplier tube (PMT) can be used as a simple example of the integration of features into level-based random selection. This application requires data sampling considering both amplitude/level and time of sampling. Since we know that the lifetime data is exponential [or a sum of exponentials depending on the number of components], this information can be embedded directly into the circuit design and data compression. As shown in FIG. 10A, we extend a group of lines with equal angle ($P\alpha$) between two lines. The intersections of these lines with the exponential decaying waveform are the most critical points for the determination of the time constant. Therefore, the most important points to capture the key features are: ($V_{peak}$,$t_1$), ($V_1$,$t_2$), ($V_3$,$t_2$) ($V_4$,$t_3$), . . . . However, these data sets do not have uniform distributions as shown in FIG. 10B. To simplify the implementation, we choose minimum $\Delta t$ and minimum $\Delta v$ as the constant time and voltage incremental changes for both the Tclk generator and comparator design.

Adaptively Adjusted Sampling

Figure 11:
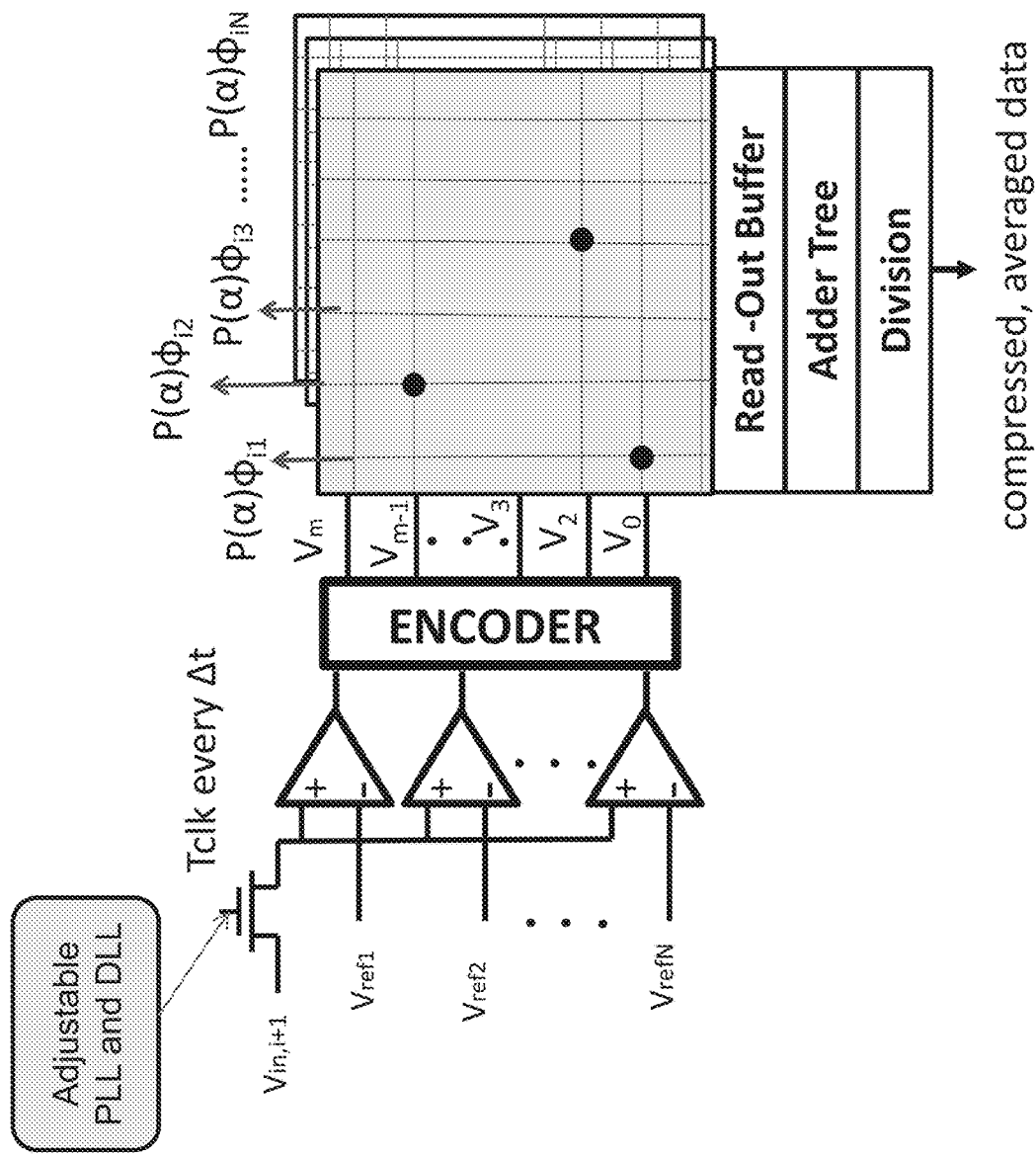
FIG. 11 shows an Adaptive Phase-locked Loop (PLL) block.

We design an Adaptive Phase-locked Loop (PLL) block [FIG. 11] to adjust the timing of when we accept a sample and propagate it through comparators. To avoid large overhead caused by such a design, we use a low power and low-jitter technique that is very similar to that discussed in [28].

Figure 12:
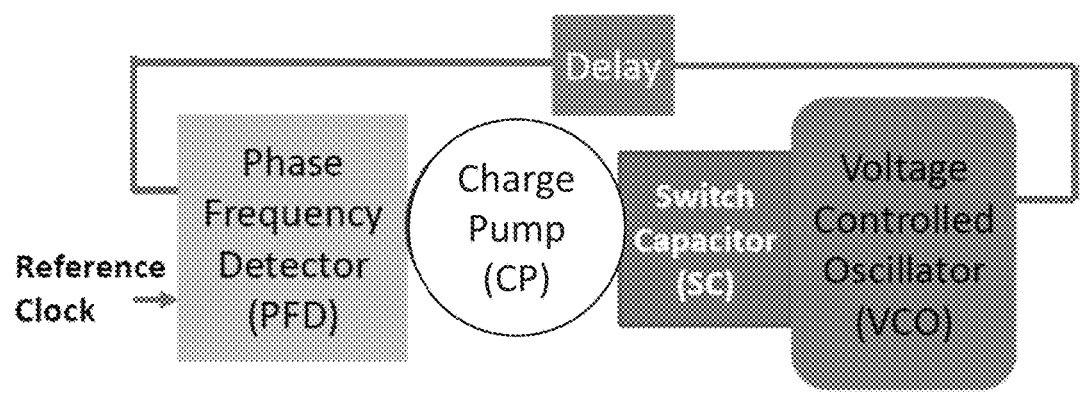
FIG. 12 shows a diagram of adaptive sampling circuit.

FIG. 12 illustrates the adaptive PLL design. The "Phase Frequency Detector" (PFD) identifies phase differences between the input and output clocks. Whenever there is a required shift of sampling time, a delay line is inserted to cause this difference ("Delay" block). The PFD detects this difference and translates it into frequency changes. A "Charge Pump" (CP) is designed to provide current to drive the rest of this design and the "Switch Capacitor" (SC) is designed to filter the ripple caused by the CP. The "Voltage Controlled Oscillator" (VCO) has both a voltage to current converter and a current controlled oscillator. To achieve full swing of the voltage, we also have a low to full voltage swing amplifier. This design provides high voltage delay change sensitivity. For every percent of voltage variation, we detect 0.2 percent delay changes. Using 90 nm UMC technology node, the design will occupy 0.01 mm² with 3 mW at 3 GHz operation frequency. Other designs listed in [29] may lead to faster implementation with more power consumption.

Experimental Results

Figure 13:
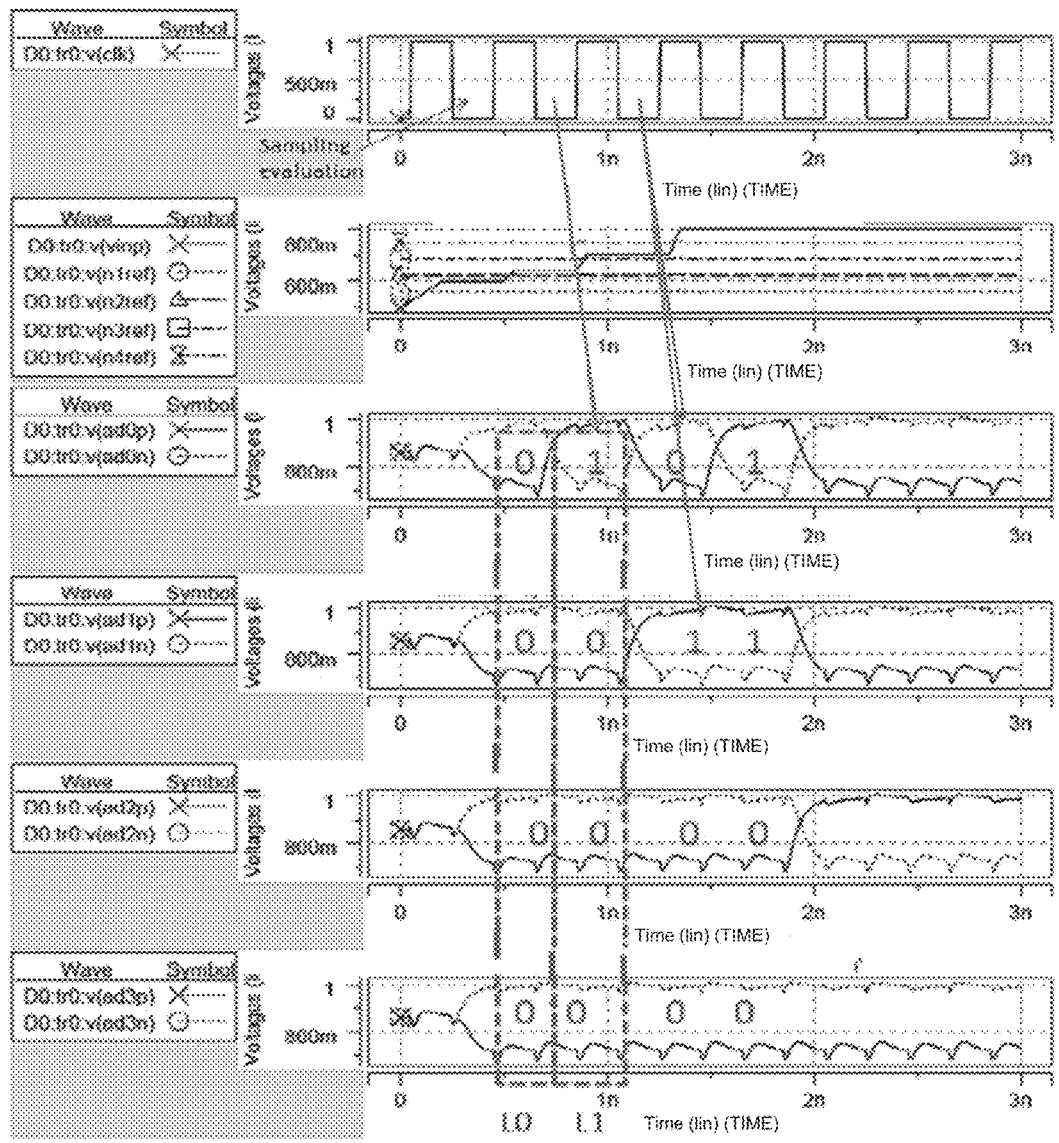
FIG. 13 shows output signals of level based random selection circuit.

FIG. 13 shows the HSPICE simulation waveforms at the output of the level based random selection circuit. We use UMC 90 nm CMOS technology nodes. The whole design has 2.4 GHz speed. The reconstructed image for an 800×800 pixel image shows a Power Signal to Noise Ratio (PSNR) of 62.33 dB. The proposed design can track a moving object with 1024×1024 pixels every 0.44 ms with recognized features.

To demonstrate the capabilities of the new approach, we have chosen mammograms which have been analyzed by other methods [30-35]. Existing mammogram systems [30-35] employ both Nyquist sampling and ADCs. While some efforts focus on improved detector designs [33], others have investigated the system design impact, especially software enhancement on image quality [34-35]. Little has been discussed on sampling and data conversion or their impact on image quality. Table 1 [43] compares the results between our proposed approach and an implementation using Nyquist and ADCs to represent existing systems. Column 1 lists the name of each test case. Column 2 provides the resolution bits for each pixel in each test case. Column 3 gives the frame size for each image. Column 4 indicates the size of the biggest feature radius cluster in each test case. Here, we have two cases without the number because the size of calcification cluster is negligible. Without the proposed design, the power per frame is listed in column 5. We also provide the power for each frame for the proposed method in column 6. Columns 7 and 8 show the reduction of power and data and column 9 shows the new SNR. In this experiment, the improvement of the new SNR is not very noticeable. On the average, this is about 5%. Because compressive sensing obtains average sensing results, in almost all cases, it provides a better SNR ratio than any other compression algorithms. On the other hand, digital mammography for calcification point detection in breast cancer in general has higher SNR ratio compared with other applications.

and can be, for instance, an analog voltage value or an analog current value in some implementations. In some examples, signal values 5811 and 5821 can correspond, for example, to a color of a pixel of a picture, to a radio frequency of a transmission signal, etc. In the same or other examples, signal values 5811 and 5821 can correspond to time-correlated measurements of a physical value, such as light, heat, or odor. For instance, the time-correlated measurements can be those of light correlated to time during a sunrise. As another example, signal values 5811 and 5821 can correspond to space-correlated measurements of a physical value, such as light, heat, or odor. For instance, the space-correlated measurements may be those of light correlated to a specific space or location within a picture.

TABLE 1

Test Benchmarks Comparison and Characteristics [43]

| TestCase | Resol (#ofbits) | FrameSize (Row × Col) | CalSize (radius) | Old(w)/ frame | New(w)/ frame | Reduction OnPower% | Reduction on data % | NewSNR (db) |
|---|---|---|---|---|---|---|---|---|
| Dense_1 | 16 | 512 × 512 | 200 um | 1.58 | 1.14 | 28.37 | 32.189 | 93.5 |
| Dense_2 | 16 | 800 × 800 | N/A | 2.43 | 1.65 | 32.4 | 43.54 | 80.13 |
| Senior_1 | 12 | 512 × 512 | N/A | 0.96 | 0.624 | 34.5 | 69.2 | 89.21 |
| Senior_2 | 12 | 800 × 800 | 3 cm | 1.57 | 0.858 | 45.3 | 57.3 | 92.14 |
| Cancer_1 | 18 | 4800 × 6388 | 4 cm | 23.58 | 18.06 | 23.8 | 68.7 | 78.39 |
| Cancer_2 | 18 | 2400 × 2400 | 5 cm | 17.33 | 11.43 | 34.3 | 53.5 | 75.24 |

Table 2 compares our proposed design with work from [23]. Even though there are several other research efforts reported, they are not the type of design we propose. For example, [39] reported a memory design for graphic applications with multicores. However, this design is placed after signals are completely digitized, and thus does not involve front end sampling and sensing. Feature extraction algorithms such as FAST [40], SIFT [41] and HoG [42] can still be executed on the multi-core processor in our design.

TABLE 2

Performance comparisons

| | Present Invention | [23] |
|---|---|---|
| Type of front end | Mostly digital | Pure analog |
| Scalability | Yes | NO |
| Technology node | 90 nm (UMC) | 0.25 um (IBM) |
| Frequency | 2.4 GHz | 10 MHz |
| Power Consumption | 30 mW | 290 mW |
| Compression | Feature based | Random selection |
| Data reduction | 40%-100% | 40-50% |
| Speed | 240x faster | slow |

Figure 14:
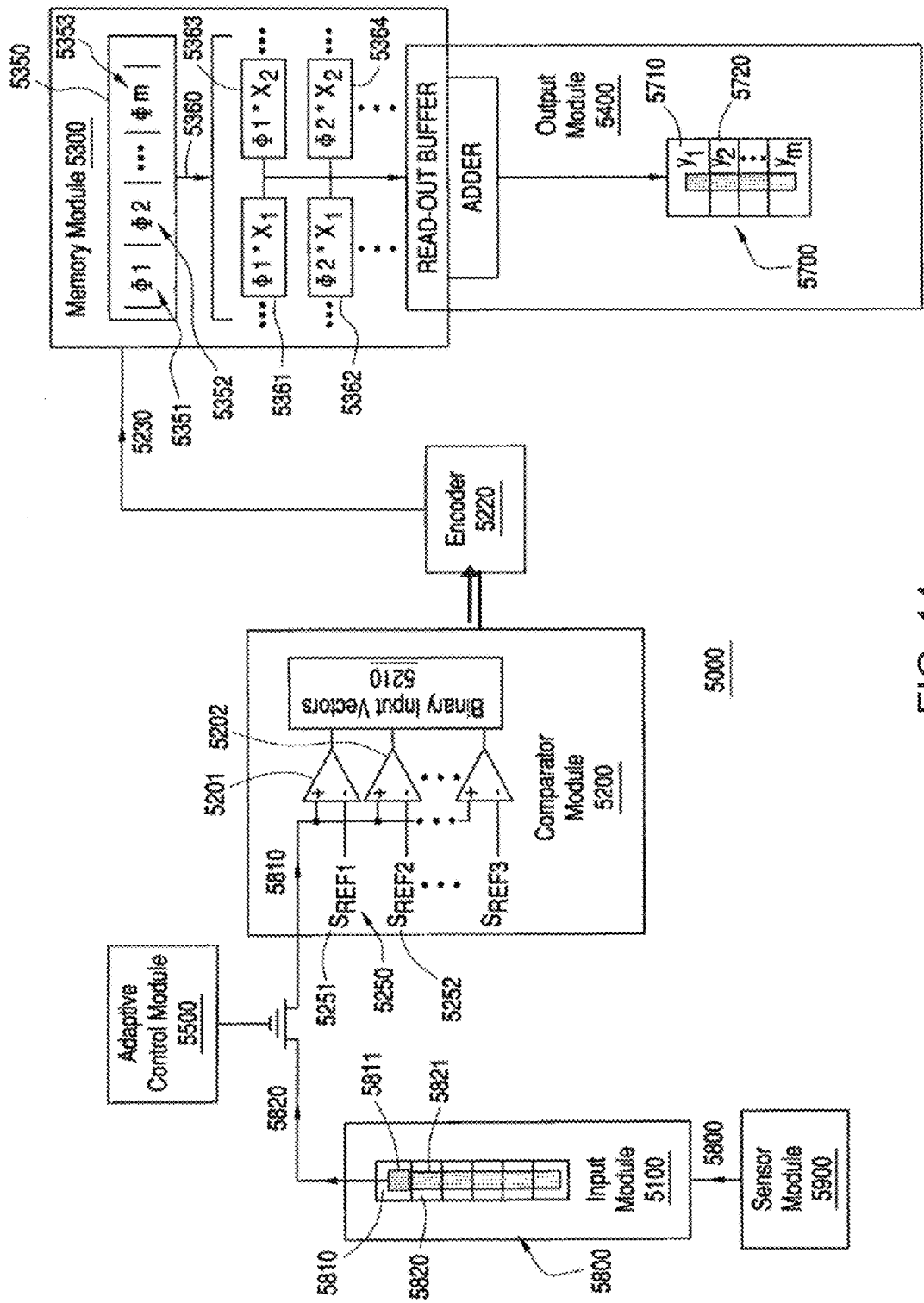
FIG. 14 shows a diagram of sensing system for carrying out compressive sensing operations.

FIG. 14 illustrates a diagram of sensing system 5000 for carrying out compressive sensing operations in accordance with the present disclosure, based on the description and drawings above and implementing the system of FIGS. 8-13.

System 5000 includes input module 5100, which is configured to receive input signal 5800 from sensor module 5900. System 5000 also includes comparator module 5200 coupled to input module 5100, memory module 5300 coupled to comparator module 5200, and output module 5400 coupled to memory module 5300.

In FIG. 14, sensing system 5000 is configured to compressively transform input signal 5800 gathered by sensor module 5900. Input signal 5800 comprises input signal portions 5810 and 5820, having respective signal values 5811 and 5821. Signal values 5811 and 5821 can be analog, Comparator module 5200 is coupled to input module 5100, and can receive therefrom input signal portions 5810 and 5820 of input signal 5800. In the present example, comparator module 5200 can receive input signal portions 5810 and/or 5820 via adaptive control module 5500, which is configured to determine the sampling of input signal 5800. For instance, such sampling can be made pursuant to a period of a clock signal of adaptive control module 5500.

Comparator module 5200 comprises a plurality of reference signal levels 5250, and is configured to generate corresponding binary input vectors 5210 for the input signal portions of input signal 5800. In the present example, comparator module 5200 comprises a plurality of operational amplifiers, such as operational amplifiers 5201, with respective operational amplifier outputs. For instance, operational amplifier 5201*a* comprises a reference input coupled to "Sref1" reference signal level 5251, while operational amplifier 5201*b* comprises a reference input coupled to "Sref2" reference signal level 5252.

Figure 15:
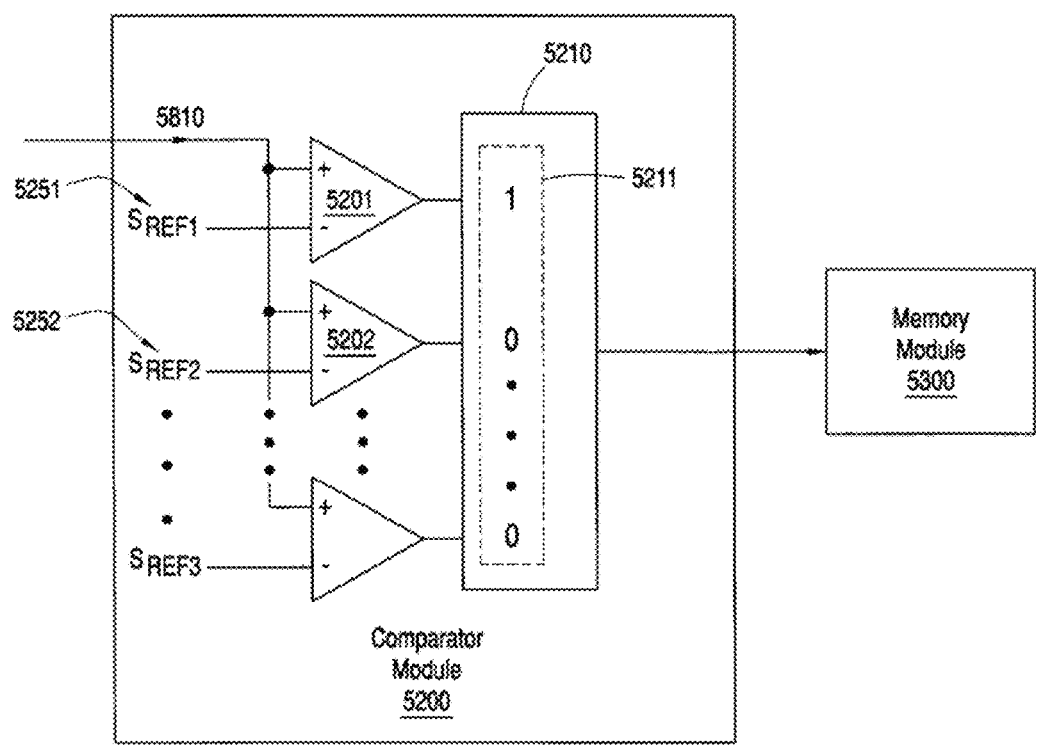
FIG. 15 shows a focused view of a comparator module.

As illustrated in FIG. 14, the plurality of operational amplifiers 5201, including operational amplifiers 5201*a*, 5201*b*, . . . , 5201*n*, receive input signal portion 5810 as an input when it reaches comparator module 5200. The plurality of operational amplifiers then compare input signal value 5811 of signal portion 5810 against their respective reference signal levels, such that the only asserted operational amplifier output is that of the operational amplifier whose reference signal level corresponds to signal value 5811 of input signal portion 5810. As an example, in the illustrations of FIGS. 14 and 15, comparator module 5200 has generated binary input vector 5211 that correlates signal value 5811 of input signal portion 5810 to reference signal level 5251, which is the "Sref1" level in the present example as denoted by the binary "1" therefore in binary input vector 5211. A similar comparison will occur when other signal portions of input signal 5800 reach comparator module 5200. For instance, when signal portion 5820 reaches comparator module 5200, binary input vector 5212 will be generated to correlate signal value 5821 to its corresponding reference signal level in 5250.

System 5000 also comprises encoder 5220 configured to generate memory address 5230 for accessing data in memory module 5300. As will be further described below, memory address 5230 defines memory location(s) where corresponding selection matrix (matrices) 5350 or portions thereof are stored in memory. Thus, when input signal portion 5810 is received, encoder 5220 can generate memory address 5230 to correspond to memory location(s) that store selection matrix (matrices) 5350 or portions thereof that are correlated to signal portion 5810 or that are to be processed with binary input vector 5211 thereof. Similarly, when input signal portion 5820 is received, encoder 5220 can generate memory address 5230 to correspond to memory location(s) that store selection matrices) 5350 or portions thereof that are correlated to signal portion 5820 or that are to be processed with binary input vector 5212 thereof.

In the present embodiment, memory module 5300 comprises selection matrices 5350 (such as selection matrices 5351 [$\Phi_1$], 5352 [$\Phi_2$] . . . 5353 [$\Phi_m$]) that have been pre-digitized and pre-stored in memory module 5300. Selection matrices 5350 can be multiplied by the incoming binary input vectors 5210 generated by comparator module 5200 to generate compressive products 5360 for compressive output 5700. Such multiplications can be carried out digitally via quick and simple bitwise logic "AND" operations between selection matrices 5350 and the incoming binary input vectors 5210, as described below.

Figure 16:
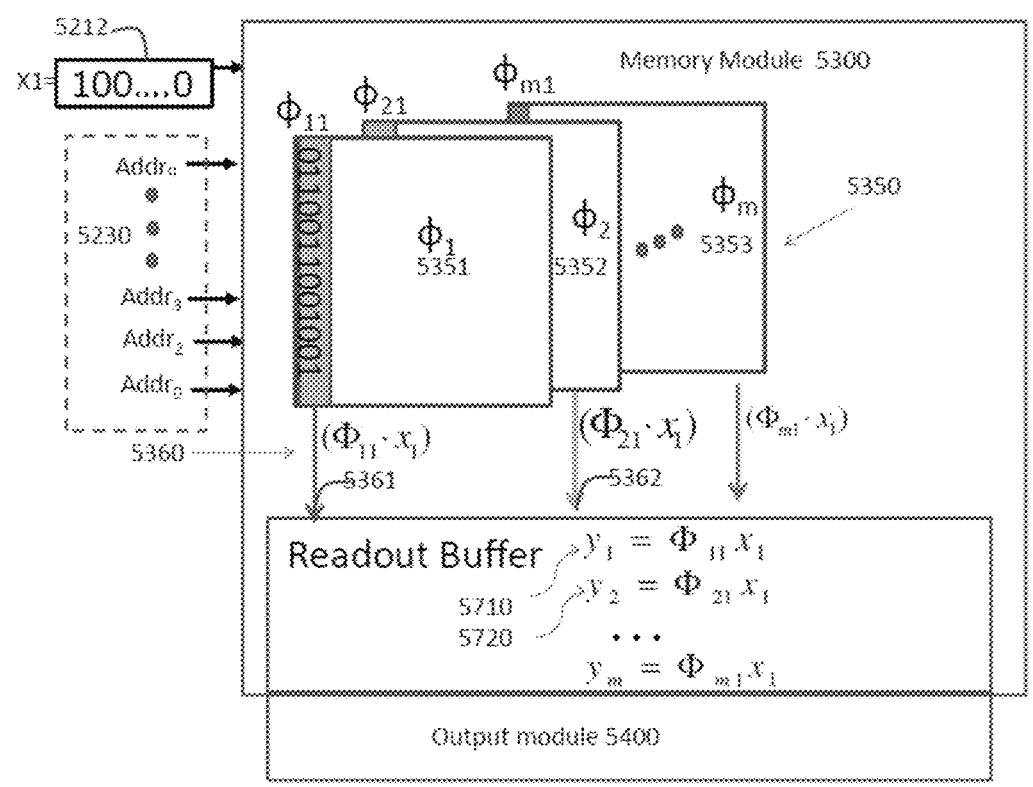
FIG. 16 shows a processing of a binary input vector of an input signal portion with selection matrices in a memory module.

FIG. 16 illustrates the processing of binary input vector 5211 of input signal portion 5810 with selection matrices 5350 in memory module 5300. For purposes of illustration and description, binary input vector 5211 is illustrated as "$X_1$". When $X_1$ reaches memory module 5300, it is multiplied by each of selection matrices 5350 to generate corresponding compressive products 5360, including compressive products 5361 and 5362. In the present example, $X_1$ is multiplied by matrix portion $\Phi_{11}$ of selection matrix $\Phi_1$ to generate compressive product 5361 ($\Phi_{11}*X_1$). $X_1$ is also multiplied by matrix portion $\Phi_{21}$ of selection matrix $\Phi_2$ to generate compressive product 5362 ($\Phi_{21}*X_1$), and so forth with the rest of selection matrices 5350. Matrix portions $\Phi_{11}$ and $\Phi_{21}$ respectively correspond to the first column of selection matrices $\Phi_1$ and $\Phi_2$ in the present example.

Figure 17:
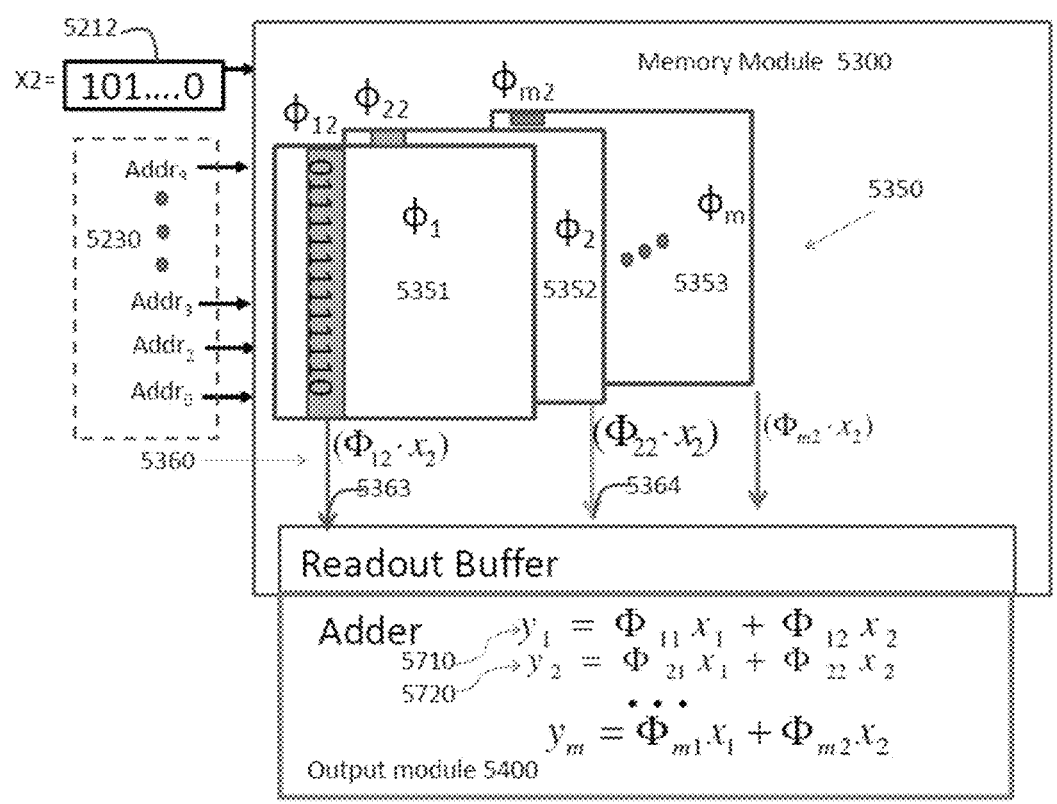
FIG. 17 shows a processing of a binary input vector of an input signal portion with selection matrices in memory module.

FIG. 17 illustrates the processing of binary input vector 5212 of input signal portion 5810 with selection matrices 5350 in memory module 5300. For purposes of illustration and description, binary input vector 5212 is illustrated as "$X_2$". When $X_2$ reaches memory module 5300, it is multiplied by each of selection matrices 5350 to generate corresponding compressive products 5360, including compressive products 5363 and 5364. In the present example, $X_2$ is multiplied by matrix portion $\Phi_{12}$ of selection matrix $\Phi_1$ to generate compressive product 5363 ($\Phi_{12}*X_2$). $X_2$ is also multiplied by matrix portion $\Phi_{22}$ of selection matrix $\Phi_2$ to generate compressive product 5364 ($\Phi_{22}*X_2$), and so forth with the rest of selection matrices 5350. Matrix portions $\Phi_{21}$ and $\Phi_{22}$ respectively correspond to the second column of selection matrices $\Phi_1$ and $\Phi_2$ in the present example.

In some implementations, compressive products 5360 from selection matrices 5350 may provide information with respect to one or more signal feature(s) being sought from input signal 5800. In some examples, selection matrices 5350 can be random selection matrices. In the same or other examples, the contents of selection matrices 5350 can be feature-based, time-based, shape-based, or wavelet-based, among others, depending on the type of information for which input signal 5800 will be sampled. In addition, although selection matrices 5350 are illustrated in the figures as two-dimensional matrices, they do not need to be limited dimensionally and can comprise, for example three-dimensional matrices in other embodiments.

Selection matrices 5350 can be pre-loaded into memory module 5300 prior to receipt of input signal 5800 at input module 5100. Furthermore, selection matrices 5350 can be pre-loaded into memory module 5300 at memory locations corresponding to the memory addresses generated by encoder 5220 for the different input signal portions (such as 5810 and 5820) of input signal 5800. As an example, as seen in the examples of FIGS. 14 and 16, selection matrices 5350 are pre-loaded into memory such that their corresponding locations in memory module 5300 correspond to memory address 5230 generated by encoder 5220 as described above for the different input signal portions (such as 5810 and 5820) of input signal 5800. Thus, when input signal portion 5810 is received by sampling system 5000, it can be quickly matched to selection matrices 5350 in memory module 5300 and/or their corresponding matrix portions (such as $\Phi_{11}$ and $\Phi_{21}$ in FIG. 16) for digital multiplication therewith, such as via digital bitwise logic "AND," without expending further computing power and time in analog conversion and multiplication.

Output module 5400 of sensing system 5000 is configured to output compressive output 5700 representative of input signal 5800 in compressed format. In particular, compressive output 5700 comprises one or more compressed output components, such as compressive output component 5710 and/or 5720, corresponding to one or more sampled ones of the input signal portions of input signal 5800, where such compressed output components of compressive output 5700 are generated from the corresponding compressive products 5360 derived as described above from selection matrices 5350 as pre-loaded in memory array 5300.

As an example, with respect to the instance represented in FIG. 14, when input signal portion 5810 is selected for sampling by adaptive control module 5500 and received at comparator module 5200, binary input vector 5211 is generated and output by comparator module 5200. As seen the focused view of comparator module 5200 in FIG. 15, the location of the binary "1" within binary input vector 5211 indicates that, for the present example, signal value 5811 of input signal portion 5810 corresponds to reference signal level 5251 or "Sref1." As also seen in FIG. 5, encoder 5220 generates memory address 5230, which is mapped to the corresponding selection matrices 5350 or matrix portions thereof (such as $\Phi_{11}$ and $\Phi_{21}$ in FIG. 16) with which binary input vector 5211 is to be digitally multiplied.

Corresponding compressive products 5361 and 5362 (FIGS. 14 and 16) of compressive products 5360 are then generated from such digital multiplication as described above. Similar operations are carried out when input signal portion 5820 is processed to generate compressive products 5363 and 5364 of compressive products 5360.

Compressive products 5360 are then processed by output module 5400 to generate compressive output components 5710 and 5720 of compressive output 5700. In particular, each signal component of compressive output 5700 corresponds to one of the selection matrices 5350, and is generated from the addition of compressive products 5360 (FIGS. 14, 16, 17) that correspond to selection matrices 5350.

As an example, compressive output component 5710 (illustrated below as "$y_1$,") corresponds to the sum of compressive products 5360 of selection matrix $\Phi_1$ (including compressive products 5361 and 5363), and can be described as:

$$y_1 = \Phi_{11} \cdot X_1 + \Phi_{12} \cdot X_2 + \ldots$$

Similarly, compressive output component 5720 (illustrated below as "$y_2$,") corresponds to the sum of compressive products 5360 of selection matrix $\Phi_2$ (including compressive products 5362 and 5364), and can be described as:

$$y_2 = \Phi_{21} \cdot X_1 + \Phi_{22} \cdot X_2 + \ldots$$

Accordingly, the last or "m"th compressive output component 5790 (illustrated below as "$y_m$,") corresponds to the sum of compressive products 5360 of selection matrix $\Phi_m$ (FIGS. 16-17), and can be described as:

$$y_m = \Phi_{m1} \cdot X_1 + \Phi_{m2} \cdot X_2 + \ldots$$

Output module 5400 comprises adder 5410 configured to add compressive products 5360 together and thereby generate compressive output components 5710 and 5720 therefrom as part of compressive output 5700.

Moving on, FIG. 18 illustrates a flowchart for a method 11000 for providing a sensor system in accordance with the present disclosure. In some embodiments, the sensor system can be similar to sensor system 5000 (FIG. 14).

Block 11100 of method 11000 comprises an input module configured to receive, from a sensor module, a first input signal portion of an input signal, the first input signal portion comprising a first signal value. In some examples, the input module can be similar to input module 5100, the sensor module can be similar to sensor module 5900, the first input signal can be similar to input signal 5800, and the first input signal portion can be similar to input signal portion 5810 (FIG. 14).

Block 11200 of method 11000 comprises providing a comparator module coupled to the input module and configured to generate, from the first input signal portion, a first binary input vector that correlates the first signal value to a first reference signal level. In some examples, the comparator module can be similar to comparator module 5200, the first binary input vector can be similar to binary input vector 5211, and/or the first reference signal level can be similar to reference signal level 5251 (FIG. 14).

Block 11300 of method 11000 comprises providing a memory module coupled to the comparator module, comprising a first selection matrix, and configured to calculate a first compressive product of the first selection matrix and the first binary input vector. In some examples, the memory module can be similar to memory module 5300, the first selection matrix can be similar to selection matrix $\varphi_1$ of selection matrices 5350, and the first compressive product can be similar to compressive product 5361 (FIGS. 14, 16).

Block 11400 of method 11000 comprises providing an output module coupled to the memory array and configured to output a compressive output having a first compressive output component comprising the first compressive product. In some examples, the output module can be similar to output module 5400, the compressive output can be similar to compressive output component 5710.

In some examples, one or more of the different blocks of method 11000 can be combined into a single block or performed simultaneously, and/or the sequence of such blocks can be changed. In the same or other examples, some of the blocks of method 11000 can be subdivided into several sub-blocks. There can also be examples where method 11000 can comprise further or different blocks. In addition, there may be examples where method 11000 can comprise only part of the blocks described above. Other variations can be implemented for method 11000 without departing from the scope of the present disclosure.

FIG. 19 illustrates a flowchart for a method 12000 for compressively transforming an input signal gathered by a sensor in accordance with the present disclosure. In some embodiments, the sensor system can be similar to sensor system 5000 (FIG. 14).

Block 12100 of method 12000 comprises receiving, at an input module, a first input signal portion of an input signal gathered by a sensor, the first input signal portion comprising a first signal value. In some examples, the input module can be similar to input module 5100, the sensor module can be similar to sensor module 5900, the first input signal can be similar to input signal 5800, and the first input signal portion can be similar to input signal portion 5810 (FIG. 14).

Block 12200 of method 12000 comprises generating, with a comparator module coupled to the input module, a first binary input vector that correlates the first signal value to a first reference signal level. In some examples, the comparator module can be similar to comparator module 5200, the first binary input vector can be similar to binary input vector 5211, and/or the first reference signal level can be similar to reference signal level 5251 (FIG. 14).

Block 12300 of method 12000 comprises generating, from a memory module coupled to the comparator module and comprising a first selection matrix, a first compressive product of the first selection matrix and the first binary input vector. In some examples, the memory module can be similar to memory module 5300, the first selection matrix can be similar to selection matrix $\Phi_1$ of selection matrices 5350, and the first compressive product can be similar to compressive product 5361 (FIGS. 14, 16).

Block 12400 of method 12000 comprises outputting, via an output module coupled to the memory array, a compressive output of the input signal such that the compressive output includes a first compressive output component comprising the first compressive product. In some examples, the output module can be similar to output module 5400, the compressive output can be similar to compressive output component 5710.

In some examples, one or more of the different blocks of method 12000 can be combined into a single block or performed simultaneously, and/or the sequence of such blocks can be changed. In the same or other examples, some of the blocks of method 12000 can be subdivided into several sub-blocks. There can also be examples where method 12000 can comprise further or different blocks. In addition, there may be examples where method 12000 can comprise only part of the blocks described above. Other variations can be implemented for method 12000 without departing from the scope of the present disclosure.

Although the in-memory compressive sensing systems and related methods herein have been described with reference to specific embodiments, various changes may be made without departing from the spirit or scope of the present disclosure. In some implementations, one or more portions or aspects of input module 5100, comparator module 5200, memory module 5300, output module 5400, and/or adaptive control module 5500 (FIG. 14) may be implemented via software, hardware, and/or a combination thereof.

As used herein, the term "about" refers to plus or minus 10% of the referenced number.

Several examples of such possible changes have been given in the foregoing description. Other permutations of the different embodiments having one or more of the features of the various figures are likewise contemplated. Accordingly, the disclosure herein is intended to be illustrative of the scope of the invention and is not intended to be limiting. It is intended that the scope of this application shall be limited only to the extent required by the appended claims. Each reference cited in the present application is incorporated herein by reference in its entirety.

The compressive sensing systems and related methods discussed herein may be implemented in a variety of embodiments, and the foregoing discussion of certain of these embodiments does not necessarily represent a complete description of all possible embodiments. Rather, the detailed description of the drawings, and the drawings themselves, disclose at least one preferred embodiment, and may disclose alternative embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are expressly stated in such claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting of", and as such the written description requirement for claiming one or more embodiments of the present invention using the phrase "consisting of" is met.

The reference numbers recited in the below claims are solely for ease of examination of this patent application, and are exemplary, and are not intended in any way to limit the scope of the claims to the particular features having the corresponding reference numbers in the drawings.

REFERENCES

1. Bill Daily, "Low-Power Architecture", Keynote, ISSCC 2005.
2. Massoud Pedram, "Low Power Design Methodologies and Techniques: An Overview", Invited Talk at Low Power Design conference, 2012.
3. Peter Hofstee, "Power Efficient Processor Architecture and The Cell Processor", invited paper, High Performance Computing, 2006.\
4. "16-Channel, 24-Bit Analog to Digital Converter", Texas Instruments Data sheet on ADS 1258 for years 2005-2011. http://www.ti.com/lit/ds/svmlink/ads1258.pdf
5. D. Donoho, "Compressive sensing," IEEE Trans. on Inform. Theory, vol. 52, no. 4, pp. 1289-1306, September 2006.
6. E. Candes, J. Romberg, and T. Tao, "Robust uncertainty principles: exact signal reconstruction from highly incomplete frequency information," IEEE Trans. on Inform. Theory, vol. 52, no. 2, pp. 489-509, February 2006.
7. E. J. Candès, J. K. Romberg, and T. Tao, "Stable signal recovery from incomplete and inaccurate measurements," Comm. Pure Appl. Math., vol. 59, no. 8, pp. 1207-1223, 2006.
8. E. Candes and J. Romberg, "Encoding the Ip ball from limited measurements," Data Compression Conference, pp. 33-42, March 2006.
9. R. Boufounos, R. G. Baraniuk, "Quantization of Sparse Representations," Data Compression Conference, p. 378, 2007.
10. R. Boufounos, R. G. Baraniuk, "Sigma Delta Quantization for Compressive Sensing." Proc. SPIE Waveletts XII. Proc. of SPIE Vol. 6701, 670104, (2007), doi: 10.1117/12.734880, August 26-29, 2007, San Diego, Calif.
11. P. Boufounos and R. G. Baraniuk, "1-bit compressive sensing," in Conf. on Info. Sciences and Systems (CISS), (Princeton, N.J.), pp. 16-21, March 2008.
12. V. Goyal, A. Fletcher, and S. Rangan, "Compressive sampling and lossy compression," IEEE Signal Processing Magazine, vol. 25, pp. 48-56, March 2008.
13. L. Jacques, D. Hammond, and M. Jalal Fadili, "Dequantizing compressed sensing: When oversampling and non-Gaussian constraints combine. arXiv:0902.2367, 2009.
14. W. Dai and O. Milenkovic, "Subspace pursuit for compressive sensing signal reconstruction," IEEE Trans. Inform. Theory, Vol. 55, No:5, pp. 2230-2249, May 2009.
15. D. Needell and J. A. Tropp, "CoSaMP: Iterative signal recovery from incomplete and inaccurate samples," Applied and Computational Harmonic Analysis, Vol. 26, No: 3, pp. 301-321, August 2009.
16. http://dsp.rice.edu/cscamera
17. M. Lin, "Analogue to Information System based on PLL-based Frequency Synthesizers with Fast Locking Schemes", Ph.D thesis, The University of Edingburgh, February 2010.
18. N. G. Prelcic, "State of the art of analog to information converters", keynote presentation, 2010.
19. M. Mishali, R. Hilgendorf, E. Shoshan, I. Rivikin, and Y. C. Eldar, "Generic Sensing Hardware and Real-Time Reconstruction for Structured Analog Signals", ISCAS 2011.
20. M. Mishali, Y. C. Eldar, and A. Elron, "Xampling: Signal acquisition and processing in union of subspaces," CCIT Report no. 747, EE Dept., Technion; arXiv.org 0911.0519, October 2009.
21. Y. C. Eldar, "Compressed sensing of analog signals in shift-invariant spaces," IEEE Trans. Signal Process., vol. 57, no. 8, pp. 2986-2997, August 2009.
22. M. Vetterli, P. Marziliano, and T. Blu, "Sampling signals with finite rate of innovation," IEEE Trans. Signal Process., vol. 50, no. 6, pp. 1417-1428, 2002.
23. A. Bandyopadhyay, J. Lee, R. W. Robucci, and P. Hasler, "Matia: A Programmable 80 uW/frame CMOS Block Matrix Transform Imager Architecture", IEEE Journal of Solid-State Circuits, Vol. 41, No. 3, March 2006. pp. 663-672.
24. A. Bandyopadhyay and P. Hasler, "A fully programmable CMOS block matrix transform imager architecture," in Proc. IEEE Custom Integrated Circuits Conf. (CICC), San Jose, Calif., 2003, pp. 2233-2236.
25. A. Bandyopadhyay, P. Hasler, and D. Anderson, "A CMOS floating-gate matrix transform imager," IEEE Sensors, vol. 5, no. 3, pp. 455-462, June 2005.

26. P. Hasler, A. Bandyopadhyay, and D. V. Anderson, "High fill-factor imagers for neuromorphic processing enabled by floating gates," *EURASIP J. Appi. Signal Process.*, pp. 676-689, 2003.
27. V. Srinivasan, G. J. Serrano, J. Gray, and P. Hasler, "A precision CMOS amplifier using floating-gates for offset cancellation," in *Proc. IEEE Custom Integrated Circuits Conf.* (*CICC*), September 2005, pp. 734-737.
28. M. Mozhgan, C. Ken Yang, "A Low-Power Low Jitter Adaptive Bandwidth PLL and Clock Buffer', ISSCC 2003.
29. J. Kim, M. Horowitz, and G. Wei, "Design of CMOS Adaptive-Bandwidth PLL/DLLs: A General Approach", IEEE Transactions on Circuit and System—II: Analog and digital Signal Processing, Vol. 50, No. 11, November 2003.
30. J. Bozek, M. Mustra, K. Delac, K. Delac, and M. Grgic, "A Survey of Image Processing Algorithms in Digital Mammography", Springer, 2009.
31. C. Quintana, S. Ojeda, G. Tirao, and M. Valente, "Mammography image detection processing for automatic micro-calcification recognition", Chilean Journal of Statistics, Vol. 2, No. 2, September 2011.
32. S. Bandyopadhyay, "Pre-processing of Mammogram Images", International Journal of Engineering Science and Technology, Vol. 2 (11), 2010, pp 6753-6758.
33. M. Yaffe, "Detectors for Digital Mammography", Springer, 2008.
34. M B. Williams, M J. Yaffe, A D Maidment, M C Martin, J A Seibert, E D. Pisano, "Image quality in digital mammography: image acquisition", Journal of American College of Radiology, August 3 (8):589-608, 2006.
35. N. Marshall, P. Monnin, H. Bosmans, F. Bochud, F. Verdun, "Image quality assessment in digital mammography: part I. Technical characterization of the systems", Physics in Medicine and Biology, July 21:56(14):4201-20, 2011.
36. http://www-stat.stanford.edu/~candes/A2IWeb/nus.html
37. J. Yoo, S. Becker, M. Mange, M. Loh, E. Candes, and A. Emami-Neyestanak, "Design and Implementation of a fully integrated compressed-sensing signal acquisition system", 2012 International conferences on Acoustics, Speech and Signal Processing, Mar. 25-30, 2012.
38. J. Yoo, S. Becker, M. Loh, M. Monge, E. Candes, and A. Emami-Neyestanak, "A 100 MHz-2 GHz 12.5× Sub-Nyquist Rate Receiver in 90 nm CMOS", 2012 IEEE Radio Frequency Integrated Circuits Symposium, Jun. 17-19, 2012.
39. J. Clemons, A. Jones, R. Perricone, S. Savarese, and T. Austin, "EFFEX: An Embedded Processor for Computer Vision based Feature Extractions", Design Automation Conference 2011.
40. E. Rosten and T. Drummond. Fusing points and lines for high performance tracking. In ICCV, volume 2, October 2005
41. D. G. Lowe. Distinctive image features from scale-invariant keypoints. IJCV, 2004.
42. N. Dalai and B. Triggs. Histograms of oriented gradients for human detection. In CVPR, 2005.
43. D. Nguyen, K. Ren, and J. M. Roveda, "A New Data Acquisition Design for Breast Cancer Detection System", IEEE-SOCC, September 2013.

What is claimed is:

1. A system to transform an input signal (5800) presented from a sensor (5900) into a spatial sequence characteristic of the signal in real-time, the system comprising:

a. an input module (5100) configured to divide the input signal (5800) into a sequence of signal values (5810) and present them in order of production to the following stage; and b. a comparator module (5200) coupled to the input module (5100) configured to accept each element value of the sequence of signal values (5810), the comparator module (5200) comprises a multiplicity of individual comparators which generate binary values assembled into a word of bits (5210) whose word value correlates the input sequence element value with a vector of reference values (5250) to effect a level crossing sampler, and which assembled word value is utilized to encode a memory address (5230), each component reference value of the reference vector (5250) being fed to a corresponding one of the individual comparators with the reference value vector (5250) being provided by an external agent;

wherein the system effects the conversion of a signal into an ordered collection of spatial values, the spatial values being the addresses of memory locations.

2. The system of claim 1, wherein a sampling gate (5500) is interposed between the input module (5100) and the comparator module (5200), controlled by an on-off level from an external agent, to effect sampling of the input signal sequence.

3. The system of claim 1 further comprising a memory module (5300) addressed by an address encoder (5220) of the comparator module; and an output module (5400) comprising output circuitry and control circuitry, wherein the memory address (5230) generated by the comparator module (5200) acting on one input signal value is used to select a particular memory location which holds a pre-computed value that correlates to the input signal value, and the output module (5400) controls the generation of output values (5700) from among the memory locations of the memory module (5300), and wherein the reference vector (5250) supplied to the comparator unit produces a domain transformation of the input signal value and the memory value selected from the comparator address encoder (5220) acting to select values from the memory module (5300) produces a mapping from input signal value to output value from the output module (5400).

4. The system of claim 1 further comprising a memory module (5300) addressed by an address encoder (5220) of the comparator module, comprising a multiplicity of memory planes (5350) such that each memory address (5230) corresponds to a multiplicity of stored values, one stored value per memory plane; and an output module (5400) comprising output circuitry and control circuitry, wherein each memory plane (5350) corresponds to a unique basis vector of some vector space and each memory plane contains addressable collections of pre-scaled copies of its corresponding basis vector, wherein operation of the system comprises taking a subsequence of input signal values of length equal to the number of memory planes and considering each signal value of the subsequence to be paired with a unique memory plane, and for each pairing of input signal value of the subsequence and its corresponding memory plane, the comparator module (5200) generates a memory address (5230) from the input signal value which is used to select a pre-scaled basis vector from the memory plane, and wherein all of the selected pre-scaled basis vectors are added together in a vector sum (5410) to become the output value (5700) of the output module (5400) causing a transformation from the vector space of the input signal subsequence to the vector space spanned by the memory module basis vectors.

5. The system of claim 4, wherein a random selection matrix, also stored in the memory module (5300), is used by the control circuitry of the output module to randomly include or discard candidate selected pre-scaled basis vectors from the accumulating vector sum to cause a linear-mapping compressive sampling.

6. The system of claim 4, wherein the vector space spanned by the stored pre-scaled basis vectors in the memory planes (5350) has lower dimension than the number of memory planes producing a projection transformation in the output vector (5700) from the vector space of the input sample subsequence, causing a further linear-mapping compression of the original data.

7. The system of claim 1, wherein the signal values arriving at this system are one of:
voltages that correspond to a measured quantity;
currents that correspond to a measured quantity; or
radiation that corresponds to a measured quantity.

8. The system of claim 1, wherein the measured quantity presented to the system represents one of:
an amplitude of a signal;
a frequency of a portion of a signal;
a temporally-correlated measurement of a physical value; or
a spatially-correlated measurement of a physical value.

9. A system to transform an input signal (5800) presented to a module that performs linear-mapping compressive sampling of the signal in real-time, the system comprising:
   a. an input module (5100) configured to divide the input signal (5800) into a sequence of signal values (5810) and present them in order of production to the following stages through a sampling gate (5500) which is controlled by gating element on-off values held in the following memory module to effect random sparse sampling in time;
   b. a comparator module (5200) coupled to the input module (5100) through the sampling gate (5500) and configured to accept each gated input element value of the sequence of signal values, the comparator module (5200) comprises a multiplicity of individual comparators which generate binary values assembled into a word of bits (5210) whose word value correlates the sequence element value with a vector of reference values (5250) to effect a level crossing sampler, and which assembled value is utilized to encode a memory address (5230), each reference value of the reference value vector (5250) being fed to a corresponding one of the individual comparators;
   c. a memory module (5300) coupled to the comparator module (5200) through an address encoder (5220), configured to select an ordered collection of pre-computed basis vectors (5360) scaled by the signal amplitude level implied by the address encoding to form one summand of an output vector, and retain a running vector sum of output vector summands, and which holds the sampling gate on-off values used by the sampling gate (5500); and
   d. an output module (5400) coupled to the memory module (5300) and configured to assemble one compressive output hit word vector for every completed successive sampling subsequence based on the accumulated vector sum held in the memory unit, the final sum vector being the output result (5700), and the memory stored vector sum being reset for the next subsequence of input samples;
   wherein the effect of these processing elements working on the input signal (5800) produces a sequence of compressive sampling output vectors that represents a reduced dimensionality sequence of the signal, compared to the sequence of signal values presented to the input module, this reduction of dimensionality being produced by selecting a subset of incoming signal values (5810) through sample gating (5500) and by utilizing a sparse random collection of basis vectors in the memory unit utilized in the formation of the output vector sum (5700).

10. The system of claim 9, wherein the sampling gate (5500) is interposed between the input module (5100) and the comparator module (5200), controlled by an on-off level from an external agent, to effect random sampling of the input signal sequence, thereby resulting in the linear-mapping compressive sampling.

11. The system of claim 9, wherein the signal values arriving at this system are one of:
voltages that correspond to a measured quantity;
currents that correspond to a measured quantity; or
radiation that corresponds to a measured quantity.

12. The system of claim 9, wherein the measured quantity presented to the system represents one of:
an amplitude of a signal;
a frequency of a portion of a signal;
a temporally-correlated measurement of a physical value; or
a spatially-correlated measurement of a physical value.

* * * * *